United States Patent [19]

Yamazaki et al.

[11] Patent Number: 4,935,710
[45] Date of Patent: Jun. 19, 1990

[54] HIGH FREQUENCY FILTER FOR ELECTRIC INSTRUMENTS

[75] Inventors: Tohru Yamazaki, Kariya; Hiroshi Sugimoto, Toyota; Takashi Sakurai, Nagoya; Toshiki Saburi, Anjo; Taisei Katoh, Aichi, all of Japan

[73] Assignee: Nippondenso Co., Ltd., Kariya, Japan

[21] Appl. No.: 206,902

[22] Filed: Jun. 15, 1988

Related U.S. Application Data

[63] Continuation of Ser. No. 755,654, Jul. 16, 1985.

[30] Foreign Application Priority Data

| Jul. 16, 1984 | [JP] | Japan | 59-147343 |
| Jul. 30, 1984 | [JP] | Japan | 59-159937 |
| Aug. 8, 1984 | [JP] | Japan | 59-166784 |
| Aug. 10, 1984 | [JP] | Japan | 59-168710 |

[51] Int. Cl.$^5$ ............................................. H03H 7/00
[52] U.S. Cl. ..................................... 333/167; 333/12; 333/204
[58] Field of Search .......... 333/12, 167, 172, 181–185, 333/202, 204, 246; 361/301–303, 305, 400, 321, 304, 311–313, 328–330

[56] References Cited

U.S. PATENT DOCUMENTS

| 1,664,494 | 4/1928 | Smith | 161/119 |
| 2,055,057 | 9/1936 | Allen | 307/90 |
| 2,464,377 | 3/1949 | Cohen et al. | 333/184 |
| 2,498,824 | 2/1950 | Rady | 307/90 |
| 2,621,251 | 12/1952 | Pontius | 333/181 |
| 2,714,194 | 7/1955 | Beynink | 439/607 |
| 3,189,847 | 6/1965 | Rymaszewski | 333/12 X |
| 3,218,585 | 11/1965 | May | 333/246 |
| 3,221,286 | 11/1965 | Fedde | 339/17 |
| 3,534,235 | 10/1970 | Buehler | 361/305 |
| 3,683,271 | 8/1972 | Kobayashi | 333/177 X |
| 3,743,978 | 7/1973 | Fritz | 333/182 |
| 3,806,767 | 4/1974 | Lehrfeld | 333/260 X |
| 3,934,074 | 1/1976 | Evelove | 174/52 R |
| 4,379,319 | 4/1983 | Wilson | 361/321 |
| 4,392,180 | 7/1983 | Nair | 361/321 |
| 4,465,538 | 8/1984 | Schmoock | 156/233 |
| 4,480,240 | 10/1984 | Gould | 333/246 |
| 4,555,494 | 11/1985 | Nishida et al. | 501/134 |
| 4,742,031 | 5/1988 | Ohya et al. | 501/134 |
| 4,743,868 | 5/1988 | Katoh et al. | 333/246 X |
| 4,782,310 | 11/1988 | Saburi et al. | 333/167 |

FOREIGN PATENT DOCUMENTS

| 0019437 | 11/1980 | European Pat. Off. . |
| 0123457 | 10/1984 | European Pat. Off. . |
| 0132327 | 11/1984 | European Pat. Off. . |
| 0135211 | 11/1984 | European Pat. Off. . |
| 974384 | 11/1960 | Fed. Rep. of Germany . |
| 1439298 | 9/1963 | Fed. Rep. of Germany . |
| 0132006 | 11/1984 | Fed. Rep. of Germany . |
| 879449 | 2/1943 | France . |
| 2254929 | 7/1975 | France | 333/172 |
| 54-110498 | 8/1979 | Japan . |
| 54-110499 | 8/1979 | Japan . |
| 54-110500 | 8/1979 | Japan . |
| 54-139098 | 10/1979 | Japan . |
| 54-149715 | 11/1979 | Japan . |
| 55-004827 | 1/1980 | Japan . |
| 55-010417 | 1/1980 | Japan . |

OTHER PUBLICATIONS

A. R. von Hippel (Editor)–"Dielectric Materials and Applications", The M.I.T. Press, Cambridge, Mass., p. 305.

Primary Examiner—Eugene R. LaRoche
Assistant Examiner—Seung Ham
Attorney, Agent, or Firm—Cushman, Darby & Cushman

[57] ABSTRACT

A high frequency filter for an electric instrument including a casing of metallic conductive material, an internal electric circuit element arranged within the casing, and a connector mounted on a peripheral wall of the casing for connecting the internal electric circuit element to an external electric circuit. The high frequency filter comprises an insulation substance layer arranged between the connector and a connection terminal of the circuit element, the insulation substance layer being made of a dielectric material whose dielectric constant decreases or increases in accordance with increase or decrease of wireless frequency applied thereto, and a pair of conductive layers formed on opposite surfaces of the insulation substance layer, one of the conductive layers being connected at one end thereof to the connector and at the other end thereof to the connection terminal of the circuit element, and the other conductive layer being connected to a portion of the casing.

17 Claims, 26 Drawing Sheets

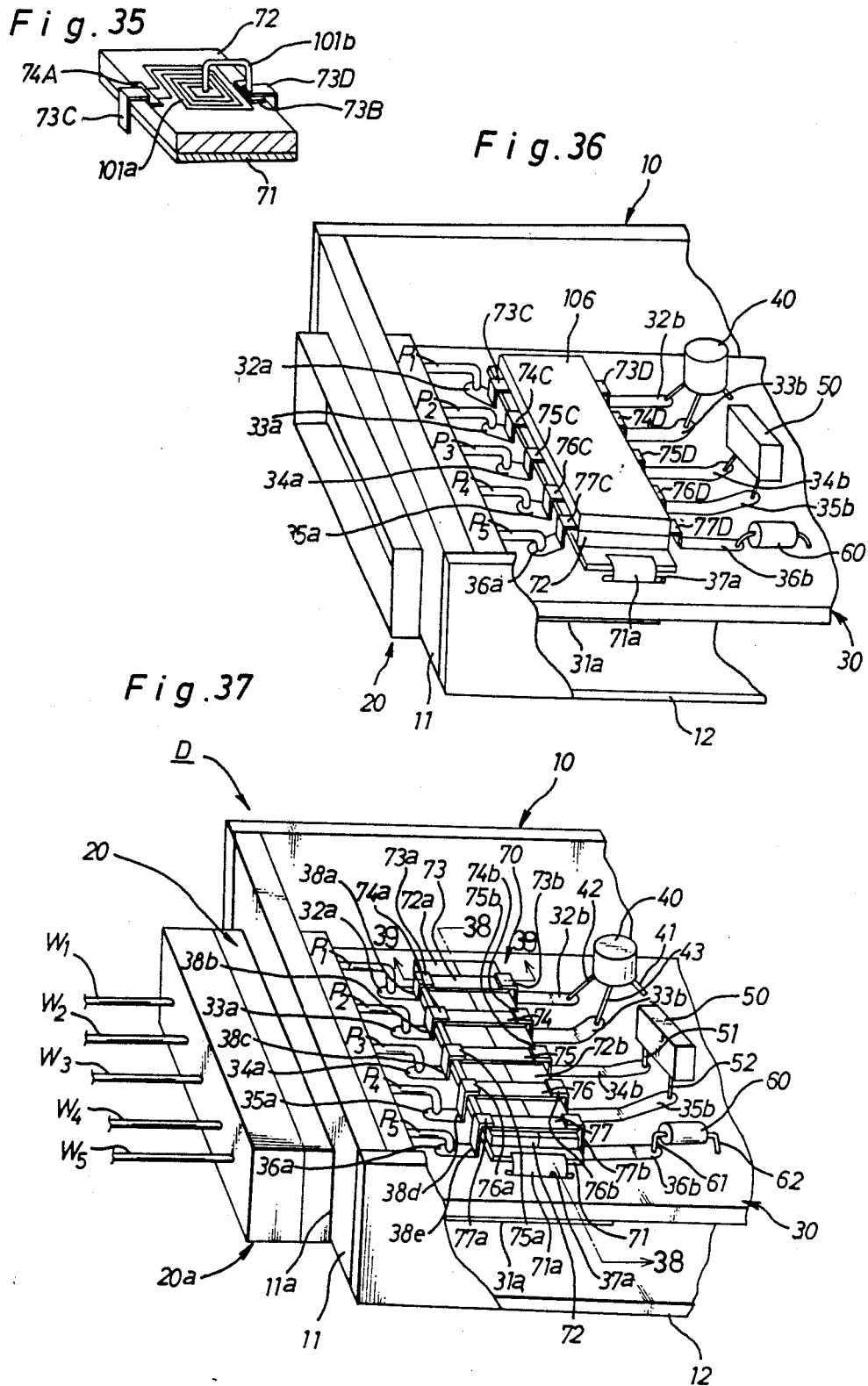

HIGH FREQUENCY FILTER FOR ELECTRIC INSTRUMENTS

BACKGROUND OF THE INVENTION

The present invention relates to a high frequency filter for electric instruments, and more particularly to a high frequency filter for protecting the electric instruments from inductive interference caused by various electromagnetic waves from a broadcasting station, an amateur wireless station, a civil wireless station, a personal wireless system, a military radar system and the like.

Although various high frequency filters of this kind have been proposed, reliable protection of the electric instruments from the inductive interference may not be effected due to insufficient band width of the filter characteristic. Meanwhile, a presently proposed high frequency filter effective in a broad radio frequency band is costly to manufacture.

SUMMARY OF THE INVENTION

A primary obejct of the present invention is to provide a high frequency filter which is constructed at a low cost to provide a distributed constant circuit effective in a broad radio frequency band.

Another object of the present invention is to provide a high frequency filter which is constructed in a simple manner to provide a concentrated constant circuit effective in a low radio frequency band and to provide a distributed constant circuit effective in a high radio frequency band.

According to the present invention there is provided a high frequency filter for an electric instrument including a casing of metallic conductive material, an internal electric circuit element arranged within the casing, and a connector mounted on a peripheral wall of the casing for connecting the internal electric circuit element to an external electric circuit. The high frequency filter comprises an insulation substance layer arranged between the connector and a connection terminal of the circuit element, the insulation substance layer being made of a dielectric material whose dielectric constant decreases or increases in accordance with increase or decrease of wireless frequency applied thereto, and a pair of conductive layers formed on opposite surfaces of the insulation substance layer, one of the conductive layers being connected at one end thereof to the connector and at the other end thereof to the connection terminal of the circuit element, and the other conductive layer being connected to a portion of the casing.

In a preferred embodiment of the present invention, the above objects have been attained by providing a high frequency filter which comprises an insulation substance layer arranged between the connector and the connection terminal of the circuit element, the insulation substance layer being made of a dielectric material such as a compound of ferro-niobate and ferrotungsten the dielectric constant of which decreases or increases in accordance with increase or decrease of wireless frequency applied thereto, a first conductive layer made of an impedance material secured to one surface of the insulation substance layer and being connected at one end thereof to the connector and at the other end thereof to the connection terminal of the circuit element, and a second conductive layer formed on the other surface of the insulation substance layer and being connected to a portion of the casing.

In a further preferred embodiment of the present invention, the above objects have been attained by providing a high frequency filter which comprises an insulation substance layer arranged between the connector and the connection terminal of the circuit element, the insulation substance layer including a first section made of a dielectic material whose dielectric constant decreases or increases in accordance with increase or decrease of wireless frequency applied thereto and further including a second section made of a magnetic material whose permeability decreases or increases in accordance with increase or decrease of wireless frequency applied thereto, and a pair of conductive layers formed on opposite surfaces of the first and second sections of the insulation substance layer, one of the conductive layers being connected at one end thereof to the connector and at the other end thereof to the connection terminal of the circuit element, and the other conductive layer being connected to a portion of the casing. In the actual practice of the present invention, it is preferable that the insulation substance layer includes at least first and second sections respectively made of a dielectric material whose dielectric constant decreases or increased in accordance with incease or decrease of wireless frequency applied thereto. Alternatively, the insulation substance layer may include at least first and second sections respectively made of a magnetic material whose permeability decreases or increases in accordance with increase or decrease of wireless frequency applied thereto.

BRIEF DESCRIPTION OF THE DRAWINGS

Additional objects and advantages of the present invention will become more readily apparent from the following detailed description of preferred embodiments thereof when taken together with the attached drawings, in which:

FIG. 35 illustrates a modification of the high frequency filter of FIG. 34;

FIG. 36 illustrates a further modification of the high frequency filter shown in FIGS. 20-22;

FIG. 37 illustrates a further modification of the high frequency filter shown in FIGS. 2-4;

In the above-described figures, the same component parts and portions are indicated by the same reference numerals and characters.

DETAILED DESCRIPTION OF THE PREFERRED EMBODIMENTS

Figure 1:
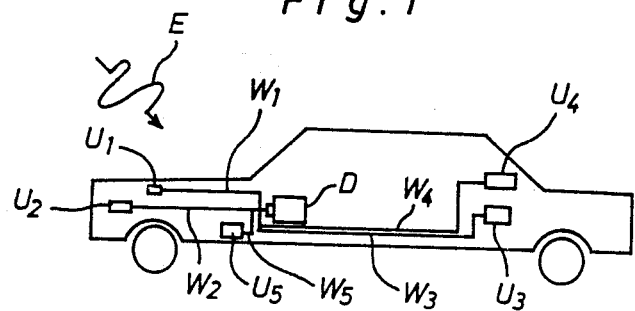
FIG. 1 is a schematic illustration of an automotive vehicle equipped with an electronic device.

Referring now to the drawings, particularly in FIG. 1 there is illustrated an automotive vehicle equipped with an electronic control system which comprises a plurality of sensors and actuators $U_1$, $U_2$, $U_3$, $U_4$ and $U_5$, and an electronic control device D connected to the sensors and actuators by way of leading wires $W_1$, $W_2$, $W_3$, $W_4$ and $W_5$. In such an arrangement, each length of leading wires $W_1$-$W_5$ is determined by relative arrangement among the respective sensors and actuators $U_1$-$U_5$ and the electronic control device D.

Figure 2:
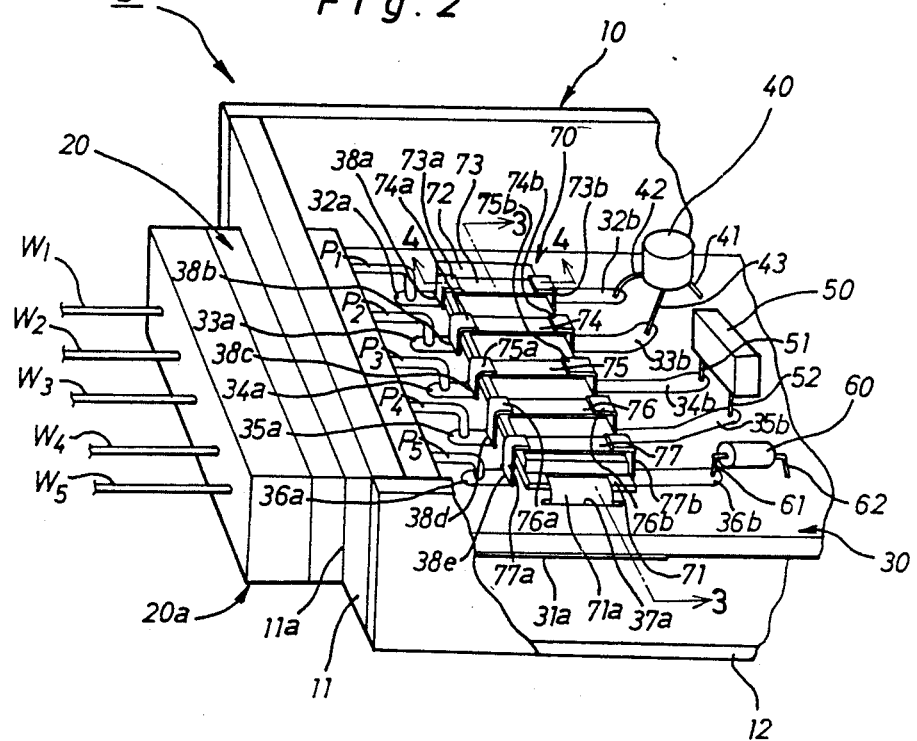
FIG. 2 is a perspective view illustrating a first embodiment of a high frequency filter in accordance with the present invention mounted within the electronic control device of FIG. 1.
Figure 3:
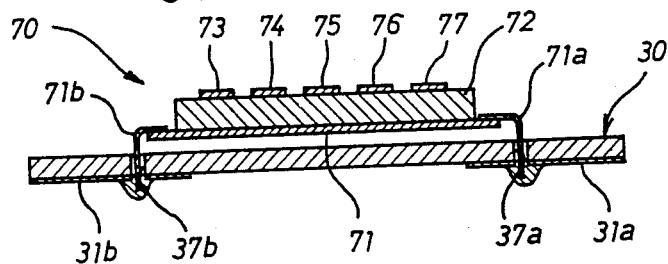
FIG. 3 illustrates a cross-section of the high frequency filter taken along line 3—3 in FIG. 2.

As is illustrated in FIGS. 2 and 3, the electronic control device D includes a casing 10 of metallic conductive material, and a connector 20 carried on the front wall 11 of casing 10. The casing 10 is mounted and insulated in place on a stationary structure in an interior of the vehicle body such as a passenger compartment, an engine room, a trunk room or the like. The connector 20 is fixedly coupled within a rectangular hole 11a in the front wall 11 and carries thereon a connector 20a connected to the leading wires $W_1$-$W_5$. The connector 20 is provided with a plurality of L-letter shaped connecting pins $P_1$-$P_5$ which are arranged in parallel to each other and connected respectively at their inner ends to the leading wires $W_1$-$W_5$ through the connector 20a.

Arranged within the casing 10 is a printed circuit board 30 of insulation material which is carried on the bottom wall 12 of casing 10 by means of a plurality of support members made of metallic conductive material (not shown). As can be well seen in FIGS. 2 and 3, a pair of laterally spaced copper thin films or plates 31a and 31b are secured to the bottom surface of printed circuit board 30 in parallel and connected to the bottom wall 12 of casing 10 through the support members. The printed circuit board 30 is integrally formed thereon with a plurality of parallel wiring layers 32a, 33a, 34a, 35a and 36a which are arranged to correspond with the connecting pins $P_1$, $P_2$, $P_3$ $P_4$ and $P_5$ which are connected at their upper faces to the lower ends of respective pins $P_1$–$P_5$. The printed circuit board 30 is further integrally formed thereon with a plurality of parallel wiring layers 32b, 33b, 34b, 35b and 36b which are arranged to correspond with the wiring layers 32a–36a, respectively. In this arrangement, there is provided a predetermined lateral space between the opposed ends of wiring layers 32a–36a and 32b–36b. The printed circuit board 30 is further provided thereon with electronic elements 40, 50 and 60. The electronic element 40 has a terminal 41 fixedly mounted on the printed circuit board 30 and a pair of terminals 42 and 43 soldered to the wiring layers 32b and 33b. The electronic element 50 has a pair of terminals 51 and 52 soldered to the wiring layers 34b and 35b, and the electronic element 60 has a terminal 61 soldered to the wiring layer 36b and a terminal 62 fixedly mounted on the printed circuit board 30.

Figure 4:
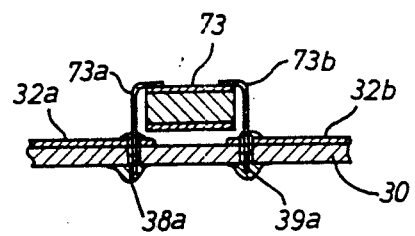
FIG. 4 illustrates a cross-section of the high frequency filter taken along line 4—4 in FIG. 2.
Figure 5:
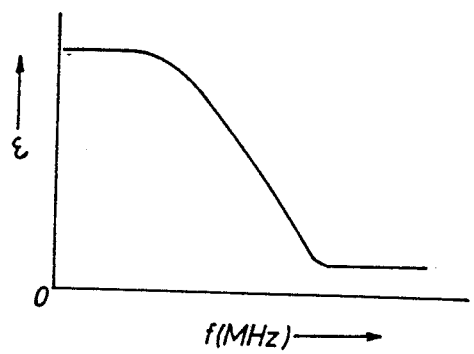
FIG. 5 is a graph illustrating a dielectric constant of an insulation substance layer in the high frequency filter of FIG. 2 in relation to wireless frequency.

As can be well seen in FIGS. 2–4, a high frequency filter 70 in accordance with the present invention is arranged in the lateral space between the wiring layers 32a36a and the wiring layers 32b–36b. The high frequency filter 70 comprises a common electrode plate 71 integrally provided at the opposite ends thereof with a pair of conductive legs 71a and 71b which are respectively inserted into common land holes 37a, 37b in the printed circuit board 30 and copper thin films 31a, 31b and soldered to the copper thin films 31a and 31b to support the electrode plate 71 above the printed circuit board 30. The high frequency filter 70 further comprises an insulation substance or layer 72 formed on the common electrode plate 71, and a plurality of parallel electrode strips 73, 74, 75, 76 and 77 integrally mounted on the upper surface of insulation substance 72. The high frequency filter 70 is characterized in that the insulation substance or layer 72 is made of a dielectric material whose dielectric constant $\epsilon$ changes in accordance with a wireless frequency f(MHz) applied thereto as shown in FIG. 5. For example, it is preferable that the dielectric material for layer 72 consists of a compound of ferro-niobate and ferrotungsten. In the high frequency filter 70, the dielectric constant $\epsilon$ of insulation layer 72 is determined to be sufficiently higher than that of the air even when decreased in accordance with increase of the wireless frequency f(MHz). Furthermore, the thickness, lateral length and width of layer 72 are determined in 0.5 mm, 20 mm and 10 mm, respectively.

As shown in FIGS. 2 and 4, the electrode strip 73 is arranged between the wiring layers 32a and 32b and is integrally provided at the opposite ends thereof with a pair of conductive legs 73a and 73b which are respectively inserted into land holes 38a, 39a in the printed circuit board 30 and wiring layers 32a, 32b and soldered to the wiring layers 32a and 32b. The remaining electrode strips 74–77 are respectively arranged between the wiring layers 33a and 33b, 34a and 34b, 35a and 35b, and 36a and 36b, and respectively provided at their opposite ends with a pair of conductive legs 74a and 74b, 75a and 75b, 76a and 76b, and 77a and 77b which are inserted into each pair of land holes 38b and 39b, 38c and 39c, 38d and 39d, 38e and 39e and soldered to each pair of wiring layers 33a and 33b, 34a and 34b, 35a and 35b, and 36a and 36b. Thus, the electrode strips 74, 75, 76 and 77 are respectively shorted to each pair of wiring layers 33a and 33b, 34a and 34b, 35a and 35b, and 36a and 36b. The land holes 38b, 38c, 38d and 38e are formed substantially in the same manner as the land hole 38a for conductive leg 73a of electrode strip 73, and the land holes 39b, 39c, 39d and 39e are also formed substantially in the same manner as the land hole 39a for conductive leg 73b of electrode strip 73.

Figure 6:
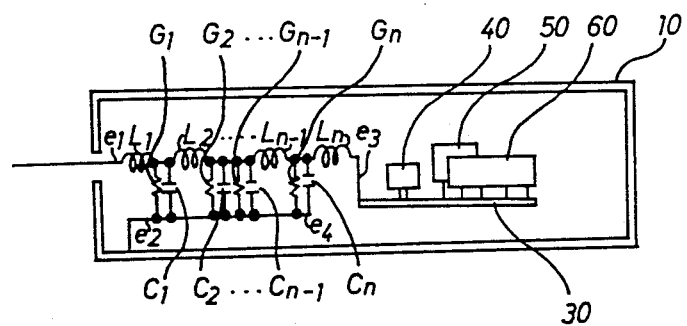
FIG. 6 illustrates a distributed constant circuit of the high frequency filter of FIG. 2.
Figure 7:
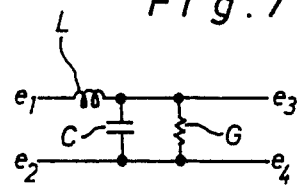
FIG. 7 illustrates an equivalent circuit of the distributed constant circuit shown in FIG. 6.
Figure 8:
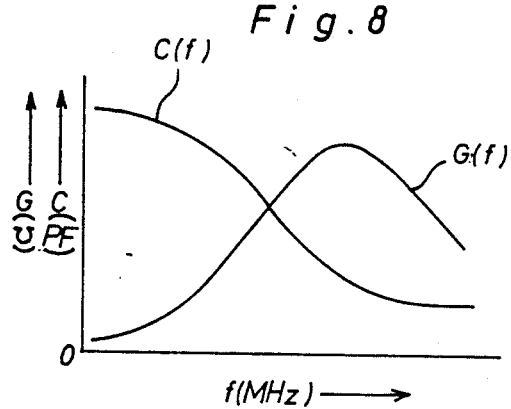
FIG. 8 is a graph illustrating the whole distributed conductance and capacitance of the equivalent circuit in relation to wireless frequency.
Figure 9:
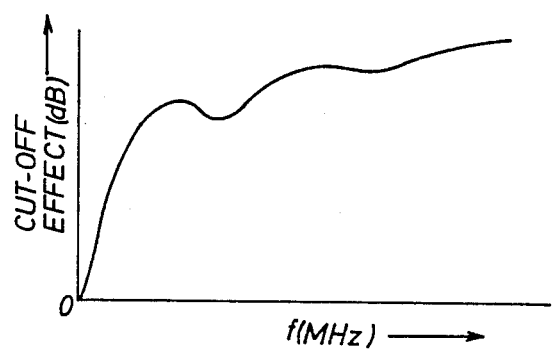
FIG. 9 is a graph illustrating the characteristic of the high frequency filter shown in FIG. 2.

In such a construction of the high frequency filter 70, the electrode strips 73, 74, 75, 76 and 77 each are opposed to the common electrode plate 71 through the insulation layer 72 to provide a plurality of parallel-plate condensers which act as a filter in a lower region of wireless frequency f. In a higher region of wireless frequency f, each of the electrode strips 73, 74, 75, 76 and 77 cooperates with the common electrode plate 71 through the insulation layer 72 to provide a plurality of distributed constant circuits of the Lecher type which includes, as is illustrated in FIG. 6, a plurality of distributed inductances $L_1, L_2 \ldots L_n$, a plurality of distributed conductances $G_1, G_2 \ldots G_n$, and a plurality of distributed capacitances $C_1, C_2 \ldots C_n$. In the case that each of the distributed constant circuits is represented by the whole distributed capacitance C, inductance L and conductance G, it becomes similar to a concentrated constant circuit illustrated in FIG. 7. In the figure, the wiring layers 32a–36a are represented by the reference character $e_1$, the copper thin films 31a and 31b are represented by the reference characters $e_2$ and $e_4$, respectively, and the wiring layers 32b–36b are represented by the reference character $e_3$. In this case, the whole distributed capacitance C and conductance G are determined by the dielectric constant $\epsilon$ of insulation layer 72 and the parallel flat-plate construction formed between the electrode strips 73–77 and the common electrode plate 71. As is illustrated in FIG. 8, the whole distributed capacitance C and conductance G are respectively indicated by characteristic curves C(f) and G(f) in relation to the wireless frequency f(MHz) applied to the high frequency filter 70. This means that as is illustrated in FIG. 9, the characteristic of high frequency filter 70 is effected substantially flat without causing any resonance phenomena in a high frequency region rather than in a low frequency region.

Assuming that as is illustrated in FIG. 1, the vehicle receives various electromagnetic waves E from a source of electromagnetic waves such as a broadcasting station, an amateur wireless station, a civil wireless station, a personal wireless system, a military rader system and the like, there will occur a high frequency inductive current I flowing to the high frequency filter 70 through the leading wires $W_1$–$W_5$ and the connectors 20a, 20. In the high frequency filter 70, the insulation layer 72 causes the inductive current I to flow toward the bottom wall 12 of casing 10 through the common electrode plate 71, the copper thin films 31a, 31b and the conductive support members and acts to block flow of the inductive current I toward the electronic elements 40, 50 and 60. Thus, the electronic elements 40, 50 and 60 are applied with only signal currents from the sensors through the leading wires $W_1$-$W_5$, connectors 20a, 20, wiring layers 32a-36a, electrode strips 73-77 and wiring layers 32b-36b without any interference of the inductive current I. In this instance, the dielectric constant ϵ of insulation layer 72 serves to effect the function of the high frequency filter 70 uniformly in a broad radio frequency band.

Figure 10:
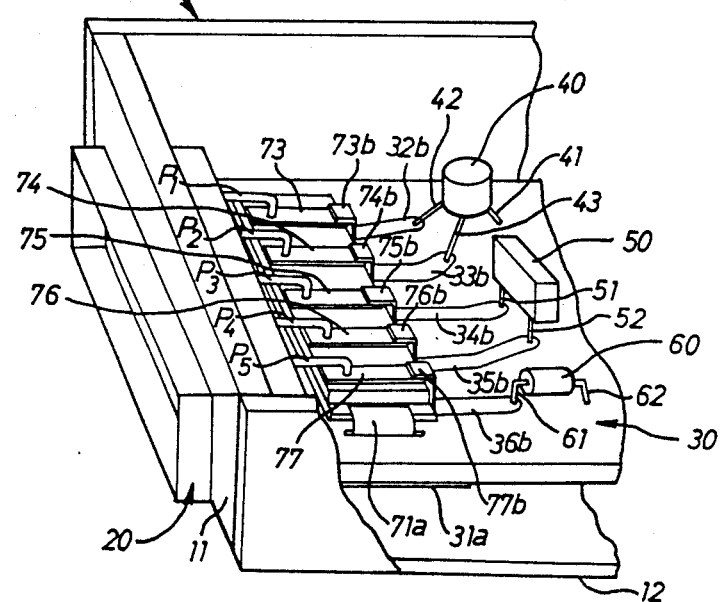
FIG. 10 illustrates a modification of the high frequency filter shown in FIG. 2.

During the manufacturing processes of the electronic control device D, the assembly of the high frequency filter 70 can be made in such a simple manner that the respective conductive legs 71a, 71b, 73a-77a, and 73b-77b are inserted into the corresponding land holes and soldered thereto. Although in the above-described first embodiment the high frequency filter 70 has been arranged between the wiring layers 32a-36a and the wiring layers 32b-36b, the electrode strips 73-77 may be directly soldered at their front ends to the connecting pins $P_1$-$P_5$ of connector 20 as is illustrated in FIG. 10. In such a modification, the wiring layers 32a-36a and their conductive legs 73a-77a can be removed to avoid high frequency noises directly applied thereto so as to enhance the characteristic of the high frequency filter 70, and the electronic control device D becomes compact in size and shape.

Figure 11:
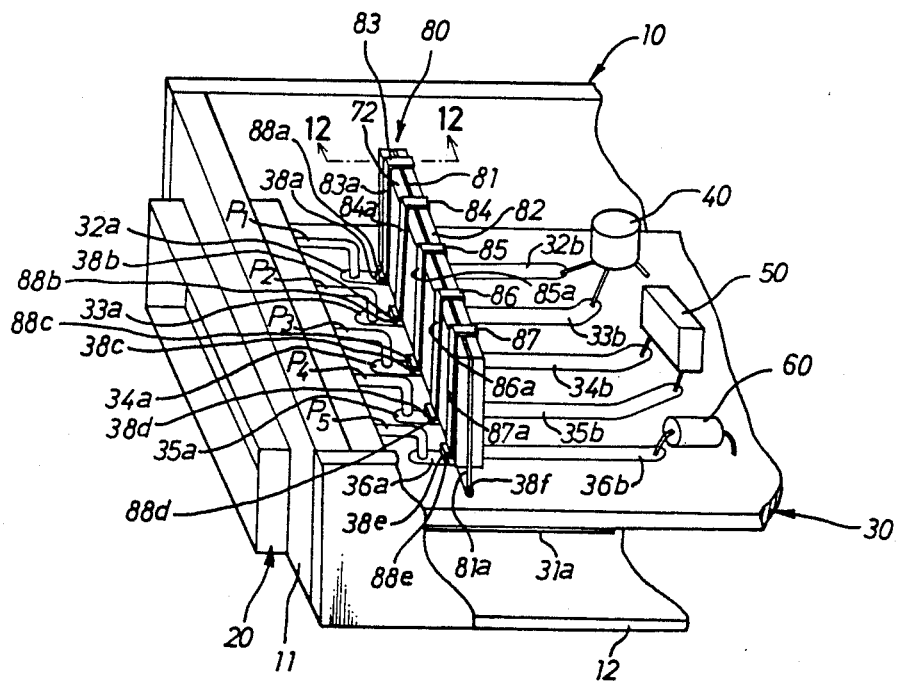
FIG. 11 illustrates a second embodiment of the high frequency filter.
Figure 12:
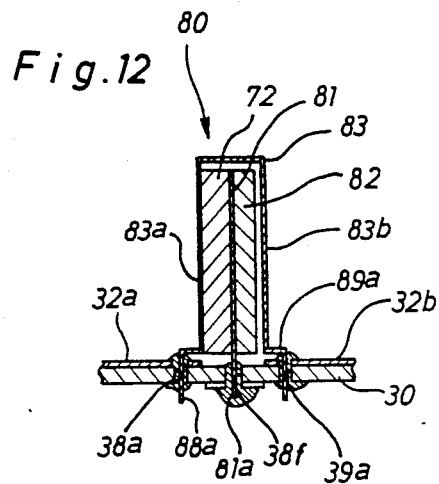
FIG. 12 is a cross-sectional view taken along line 12—12 in FIG. 11.

In FIGS. 11 and 12, there is illustrated a second embodiment of the present invention wherein the high frequency filter 70 is replaced with an upright high frequency filter 80 on the printed circuit board 30. The upright high frequency filter 80 comprises a common electrode plate 81 which is vertically arranged between the wiring layers 32a-36a and the wiring layers 32b-36b. The lower end of electrode plate 81 is inserted into a land hole 38f in board 30 and copper thin plates 31a, 31b and soldered to the respective copper thin plates 31a, 31b. The upright high frequency filter 80 further comprises an insulation layer 72 secured to the front surface of common electrode plate 81, an aluminous base plate 82 secured to the rear surface of common electrode plate 81, and a plurality of U-letter shaped electrode strips 83, 84, 85, 86 and 87 coupled over the insulation layer 72, common electrode plate 81 and aluminous base plate 82. The insulation layer 72 is substantially the same as that in the first embodiment, and the aluminous base plate 82 is adapted to reinforce the common electrode plate 81.

As can be well seen in FIG. 11, the electrode strips 83-87 are arranged in parallel to each other between the wiring layers 32a-36a and the wiring layers 32b-36b and secured to the front surface of insulation layer 72 to be positioned perpendicular to the printed circuit board 30. The electrode strip 83 has a front arm portion 83a integrally provided at its lower end with a conductive leg 88a and a rear arm portion 83b integrally provided at its lower end with a conductive leg 89a. The front conductive leg 88a is inserted into the land hole 38a in board 30 and soldered to the wiring layer 32a, while the rear conductive leg 89a is inserted into the land hole 39a in board 30 and soldered to the wiring layer 32b. In such an arrangement, a portion between the front and rear arm portions 83a and 83b of electrode strip 83 is spaced from the upper ends of insulation layer 72, common electrode plate 81 and aluminous base plate 82, and the rear arm portion 83b of electrode strip 83 is also spaced from the rear surface of aluminous base plate 82. Thus, the electrode strip 83 is shorted to the wiring layers 32a and 32b at its front and rear arm portions 83a and 83b.

As is illustrated in FIG. 11, the remaining electrode strips 84-87 each are secured at their front arm portions 84a-87a to the front surface of insulation layer 72 substantially in the same manner as the electrode strip 83. The front arm portions 84a-87a of electrode strips 84-87 are integrally provided at their lower ends with conductive legs 88b-88e which are respectively inserted into the land holes 38b-38e in board 30 and soldered to the wiring layers 33a-36a. The rear arm portions of electrode strips 84-87 are integrally provided at their lower ends with conductive legs which are inserted into the land holes 39b-39e in board 30 and soldered to the wiring layers 33b-36b. In such an arrangement, the electrode strips 84-87 are spaced from the upper ends of insulation layer 72, common electrode plate 81 and aluminous base plate 82 and also spaced from the rear surface of aluminous base plate 82. In the upright high frequency filter 80, the common electrode plate 81 and electrode strips 83-87 correspond with the common electrode plate 71 and electrode strips 73-77 of the first embodiment.

In use of the high frequency filter 80, various electromagnetic waves entering into the vehicle will give rise to a high frequency inductive current I flowing to the high frequency filter 80 through the leading wires $W_1$-$W_5$ and the connectors 20a, 20. In this instance, the insulation layer 72 of filter 80 causes the inductive current I to flow toward the bottom wall 12 of casing 10 through the common electrode plate 81, the copper thin films 31a, 31b and the conductive support members and acts to block flow of the inductive current I toward the electronic elements 40, 50 and 60. Thus, the electronic elements 40, 50 and 60 are applied with only signal currents from the sensors through the leading wires $W_1$-$W_5$, connectors 20a, 20, wiring layers 32a-36a, electrode strips 83-87 and wiring layers 32b-36b without any interference caused by the inductive current I. In such a condition, the common electrode plate 81 in upright high frequency filter 80 serves to isolate the electronic elements 40, 50 and 60 from the connector 20 so as to block the electromagnetic waves directly applied thereto from the inside opening of connector 20. Furthermore, in such a construction of the uprigh high frequency filter 80, it is advantageous that the common electrode plate 81 is in contact with the copper thin films 31a, 31b at a sufficient area to ensure short-circuit to the casing 10.

Figure 13:
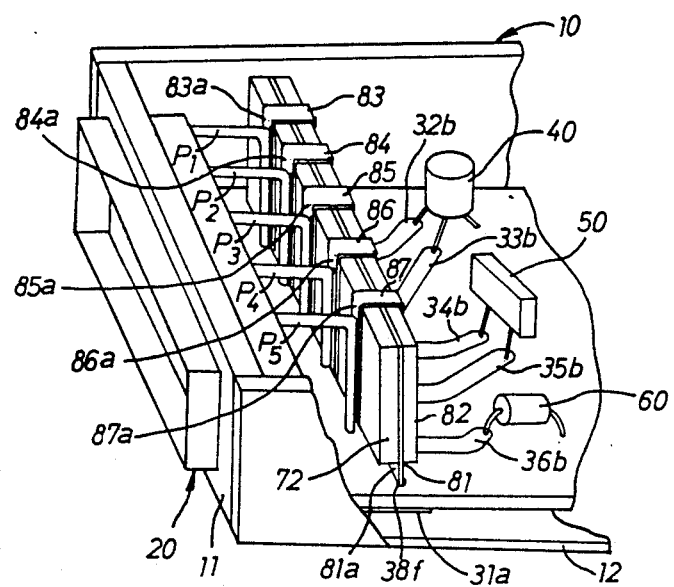
FIGS. 13-15 illustrate other modifications of the second embodiment shown in FIG. 11.

Although in the second embodiment, the upright high frequency filter 80 has been mounted on the printed circuit board 30 between the wiring layers 32a-36a and the wiring layer 32b-36b, the electrode strips 83-87 may be directly soldered at their front arm portions 83a-87a to the connecting pins $P_1$-$P_5$ of connector 20 as is illustrated in FIG. 13. In this modification, the connecting pins $P_1$-$P_5$ of connector 20 are elongated downwardly to ensure engagement with the respective front arm portions 83a-87a of electrode strips 83-87. With such an arrangement, the wiring layers 32a-36b and their conductive legs 88a-88e can be removed to avoid high frequency noises directly applied thereto so as to enhance the characteristic of the high freuency filter 80, and the electronic control device D becomes compact in size and shape.

Figure 14:
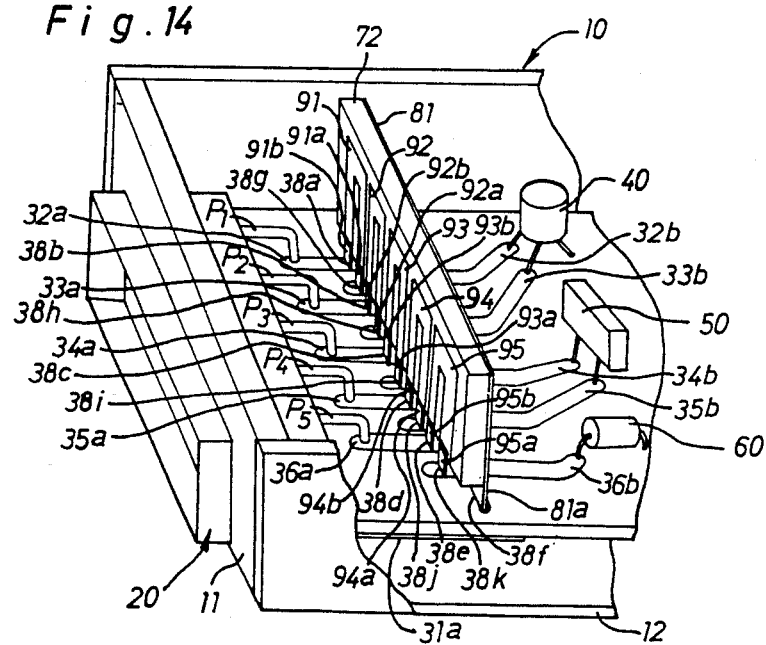
Figure 15:
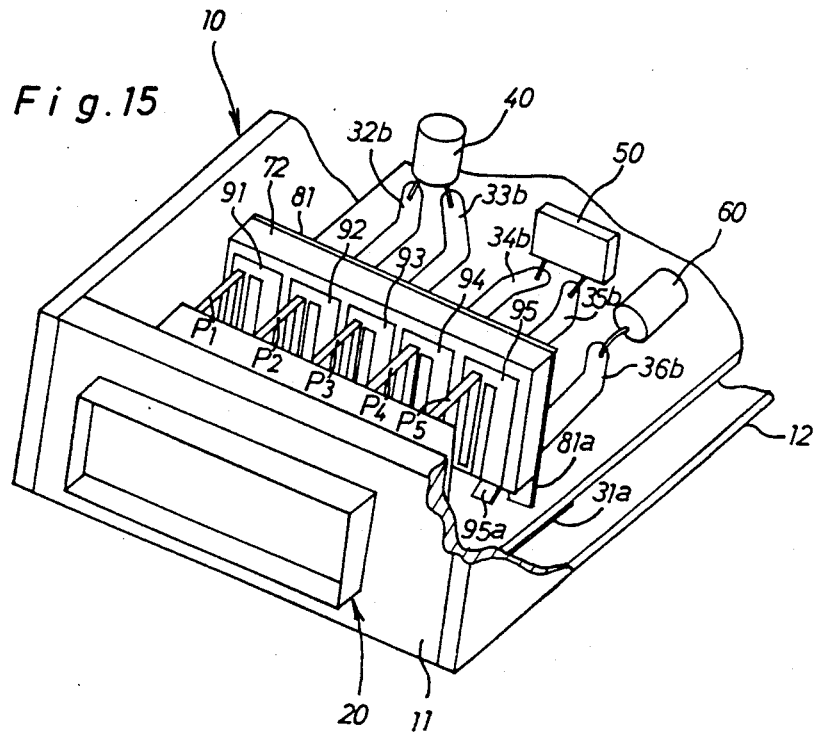

In FIG. 14, there is illustrated another modification of the second embodiment wherein the electrode strips 83-87 are replaced with U-letter shaped electrode strips 91, 92, 93, 94 and 95 which are secured to the front surface of insulation layer 72. In this modification, the wiring layer 32b is extended between the wiring layers 32a and 33a, the wiring layer 33b is extended between the wiring layers 33a and 34a, the wiring layer 34b is extended between the wiring layers 34a and 35a, the wiring layer 35b is extended between the wiring layers 35a and 36a and the wiring layer 36b is extended at the left side of wiring layer 36a. The electrode strips 91–95 are integrally provided at their left arm portions with conductive legs 91a, 92a, 93a, 94a and 95a which are inserted into land holes 38g, 38h, 38i, 38j and 38k and soldered to the wiring layers 32b, 33b, 34b, 35b and 36b. The electrode strips 91–95 are integrally provided at their right arm portions with conductive legs 91b, 92b, 93b, 94b and 95b which are inserted into land holes 38a, 38b, 38c, 38d and and 38e and soldered to the wiring layers 32a, 33a, 34a, 35a and 36a. In the modification of FIG. 14, the aluminous base plate 82 of FIG. 11 can be removed to make the high frequency filter 80 more compact in size and shape, and the electrode strips 91–95 are secured only to the front surface of insulation layer 72 to enhance productivity of the filter 80. In a further modification of the second embodiment, the aluminous base 81 may be replaced with an insulation base plate for reinforcement of the insulation layer 72. Alternatively, as is illustrated in FIG. 15, the electrode strips 91–95 of FIG. 14 may be directly soldered at their right arm portions to the connecting pins $P_1P_5$ of connector 20. In such a modification, the wiring layers 32a–36a and the conductive legs 91b–95b can be removed to effect substantially the same advantages as those in the high frequency filter of FIG. 13.

Figure 16:
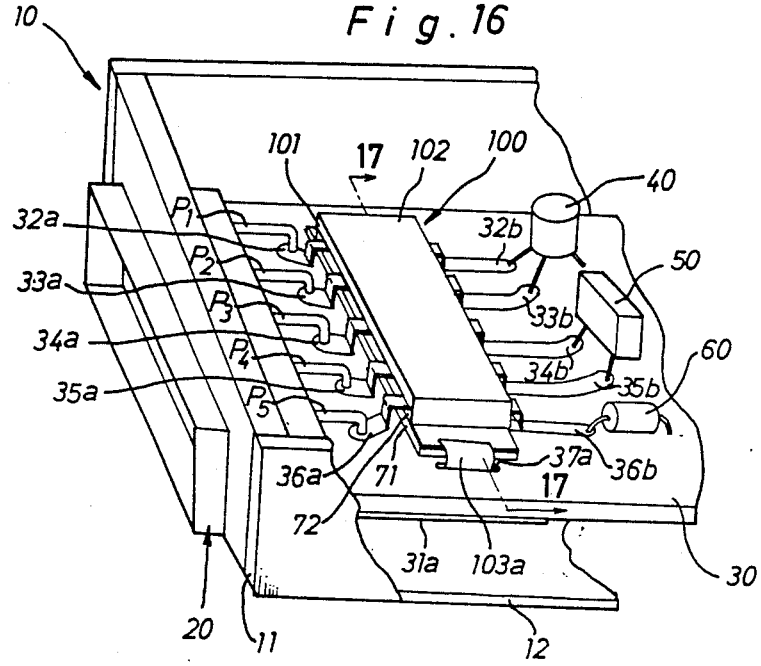
FIG. 16 illustrates a third embodiment of the high frequency filter.
Figure 17:
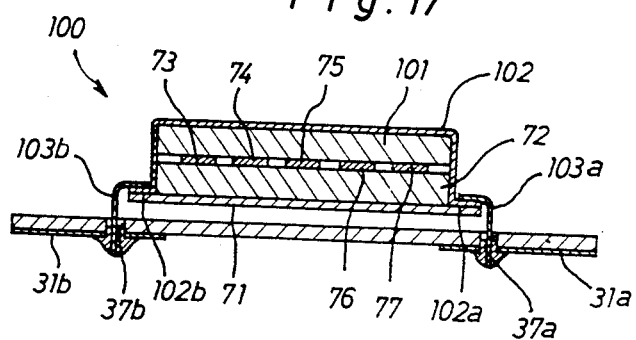
FIG. 17 is a cross-sectional view taken along line 17—17 in FIG. 16.

In FIGS. 16 and 17, there is illustrated a third embodiment of the present invention wherein the high frequency filter 70 is replaced with a high frequency filter 100 mounted on the printed circuit board 30. The high frequency filter 100 comprises an insulation substance or layer 101 made of the same material as that of the insulation layer 72 of the first embodiment, which layer 100 is mounted on the insulation layer 72 through the electrode strips 73–77. The high frequency filter 100 further comprises a common electrode plate 102 of U-shaped cross-section which is arranged to contain therein the insulation layers 72 and 101 and electrode strips 73–77 and has a pair of flanges 102a and 102b soldered to the flat common electrode plate 71. The flanges 102a and 102b of electrode plate 102 are respectively provided with conductive legs 103a and 103b which are inserted into the respective land holes 37a, 37b and soldered to the respective copper thin films 31a and 31b to support the flat common electrode plate 71 above the printed circuit board 30. Thus, the high frequency filter 100 is characterized in that the electrode strips 73–77 are arranged between the insulation layers 72 and 101 to provide a pair of high frequency filters. It is, therefore, noted that the characteristic of the high frequency filter 100 becomes two times than that of the high frequency filter 70 of the first embodiment. In other words, the high frequency filter 100 can be constructed in half size to effect substantially the same characteristic as that of the high frequency filter 70 of the first embodiment.

Figure 18:
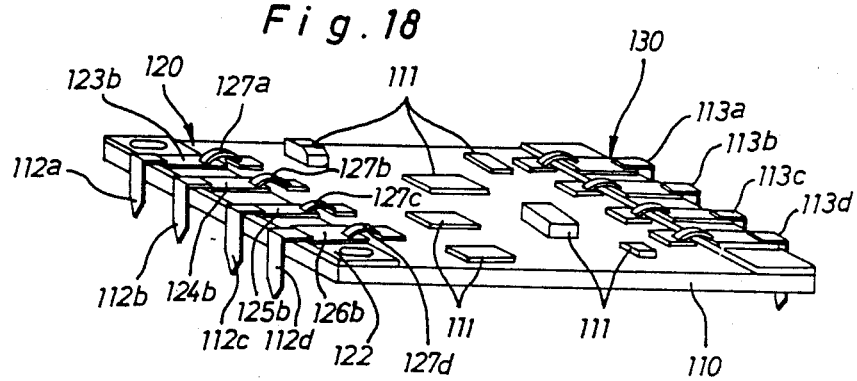
FIG. 18 illustrates a fourth embodiment of the high frequency filter.
Figure 19:
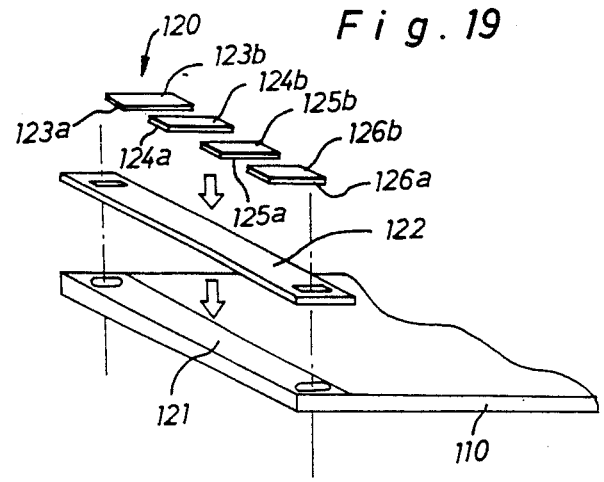
FIG. 19 illustrates disassembled parts of the four embodiment shown in FIG. 18.

In FIGS. 18 and 19, there is illustrated a fourth embodiment of the present invention wherein two high frequency filters 120 and 130 are adapted to an hybrid electronic device including a plurality of hybrid electronic elements 111—111 mounted on an hybrid base plate 110 such as an aluminous base plate or a vitreous enamel base plate. The high frequency filter 120 is mounted on the hybrid base plate 110 between the hybrid electronic elements 111—111 and a plurality of terminal plates 112a–112d for connection to external circuits (not shown). On the other hand, the high frequency filter 130 is mounted on the hybrid base plate 110 between the hybrid electronic elements 111—111 and a plurality of terminal plates 113a–113d for connection to external circuits (not shown). The high frequency filter 120 comprises a conductive thin film 121 printed on the hybrid base plate 110, a common electrode plate 122 overlapped with the conductive thin film 121, a plurality of insulation layers 123a–126a arranged in parallel to each other for connection to the respective terminal plates 112a–112d and mounted on the common electrode plate 122, and a plurality of wiring layers 123b–126b respectively secured to the insulation layers 123a–126a. The insulation layers 123a–126a each are made of the same material as the insulation layer 72 of the first embodiment. The wiring layers 123b–126b are respectively connected at their one ends to the terminal plates 112a–112d and at their other ends to the hybrid electronic elements 111—111 by means of a plurality of connecting terminal plates 127a–127d. The conductive thin film 121 is shorted to a metallic casing (not shown) through the hybrid base plate 110, and the high frequency filter 130 is constructed substantially in the same manner as the high frequency filter 120.

In use of the high frequency filters 120 and 130, various electromagnetic waves will give rise to a high frequency current I respectively flowing to the high frequency filters 120 and 130 through the terminal plates 112a–112d and 113a–113d. In this instance, each of the high frequency filters 120 and 130 causes the inductive current I to flow toward the metallic casing through the common electrode plates and the conductive thin films and acts to block flow of the inductive current I toward the hybrid electronic elements 111—111. Although in the above embodiments and modifications, the casing 10 of metallic conductive material has been insulated from the ground, it may be grounded on a portion of the vehicle body. In the case that the electronic elements have a proof property against the electromagnetic waves, the casing 10 may be partly formed by the metallic conductive material.

Figure 20:
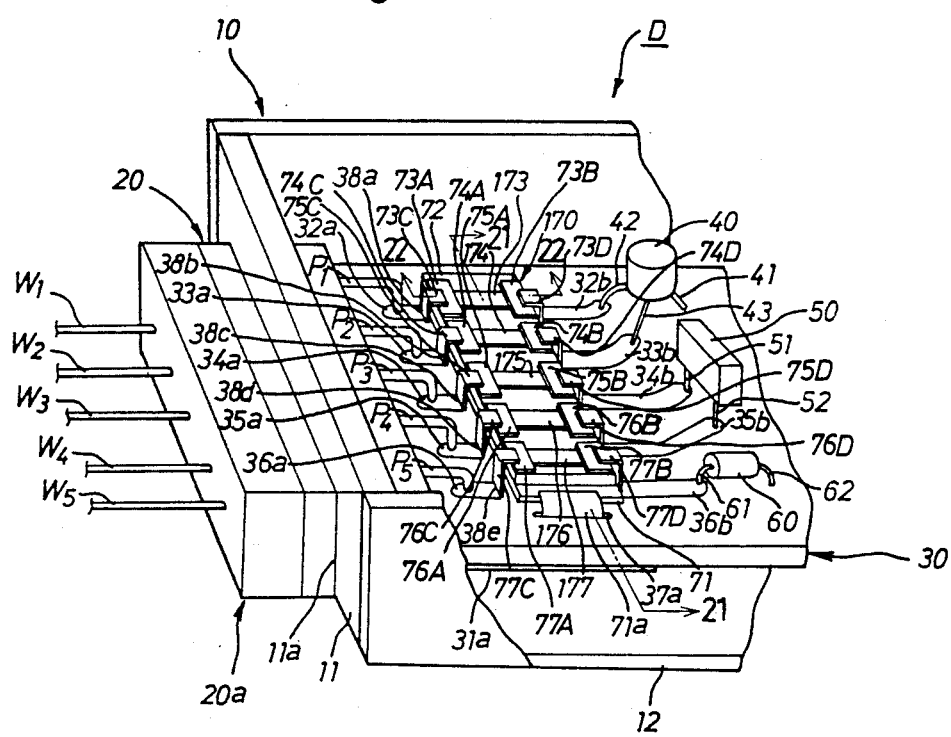
FIG. 20 illustrates a modification of the first embodiment shown in FIG. 2.
Figure 21:
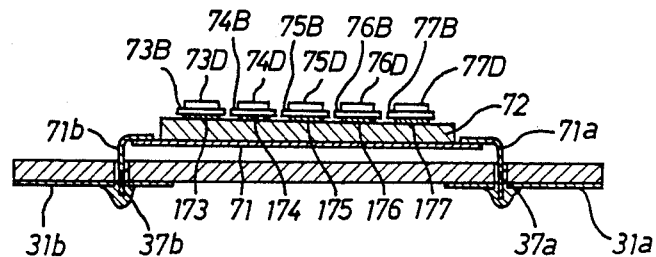
FIG. 21 is a cross-sectional view taken along line 21—21 in FIG. 20.
Figure 22:
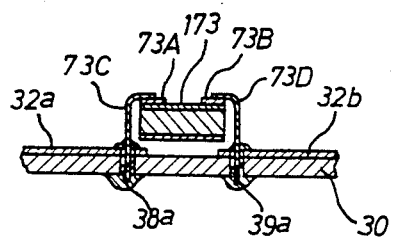
FIG. 22 is a cross-sectional view taken along line 22—22 in FIG. 20.
Figure 23:
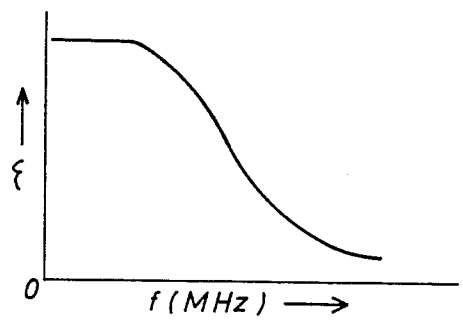
FIG. 23 is a graph illustrating a dielectric constant of an insulation substance layer in the high frequency filter of Fig.20.

In FIGS. 20–22, there is illustrated a modification of the first embodiment, wherein the high frequency filter 70 is replaced with a high frequency filter 170. In the high frequency filter 170, the electrode strips 73–77 of the first embodiment are replaced with a plurality of parallel resistance layers 173–177 printed on the insulation layer 72 of the first embodiment. The resistance layers 173–177 each are made of a resistance material such as conductive paint for print including carbon as a main component. The resistance layer 173 is integrally formed thereon with a pair of spaced electrode strips 73A and 73B which are provided thereon with conductive legs 73C and 73D, respectively. The conductive legs 73C and 73D are respectively inserted into the land holes 38a and 39a and soldered to the wiring layers 32a and 32b. Thus, the resistance layer 173 is shorted to the wiring layers 32a and 32b through the electrode strips 73A and 73B by means of the conductive legs 73C and 73D. The remaining resistance layers 174–177 are also respectively formed thereon with a pair of spaced electrode strips 74A, 74B; 75A, 75B; 76A, 76B; and 77A, 77B which are respectively provided thereon with conductive legs 74C, 74D; 75C, 75D; 76C, 76D; and 77C, 77D. These conductive legs are respectively inserted into the land holes 38b, 39b; 38c, 39c; 38d, 39d; and 38e, 39e and soldered to the wiring layers 33a, 33b; 34a, 34b;

35a, 35b; and 36a, 36b. Thus, the resistance layers 174–177 are shorted to the wiring layers 33a, 33b; 34a, 34b; 35a, 35b; and 36a, 36b respectively through the electrode strips 74A, 74B; 75A, 75B; 76A, 76B; and 77A, 77B. The other construction of the high frequency filter 170 is substantially the same as that of the high frequency filter 70.

In such a construction of the high frequency filter 170 as described above, the resistance layers 173–177 each are opposed to the common electrode plate 71 through the insulation layer 72 to provide parallel two lines, and also the electrode strips 73A–77A and 73B–77B each are opposed to the common electrode plate 71 through the insulation layer 72 to provide parallel two lines. Thus, the high frequency filter 170 acts as a parallel-plate condenser in a lower region of the wireless frequency f and acts as a distributed constant circuit of the Lecher type in a higher region of the wireless frequency f. As is illustrated in FIG. 24, the Lecher type distributed constant circuit is composed of a Lecher type distributed constant circuit $A_f$ formed by the electrode strips 73A–77A cooperating with the common electrode plate 71 through the insulation layer 72, a Lecher type distributed constant circuit B formed by the resistance layers 173–177 cooperating with the common electrode plate 71 through the insulation layer 72, and a Lecher type distributed constant circuit $A_r$ formed by the electrode strips 73B–77B cooperating with the common electrode plate 71 through the insulation layer 72, the constant circuits $A_f$, B and $A_r$ being in cascade connection to one another.

Figure 24:
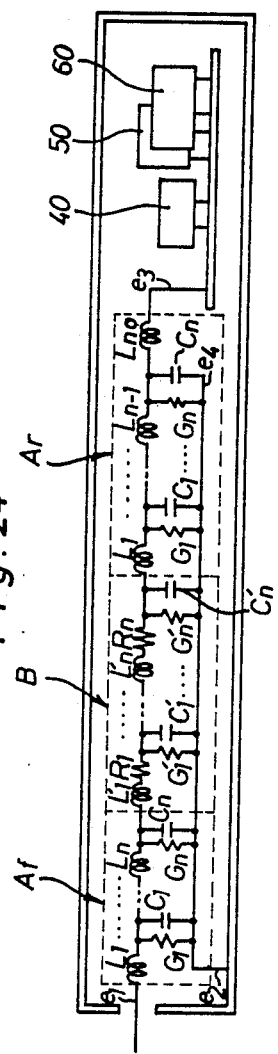
FIG. 24 illustrates a distributed constant circuit of the high frequency filter of FIG. 20.
Figure 26:
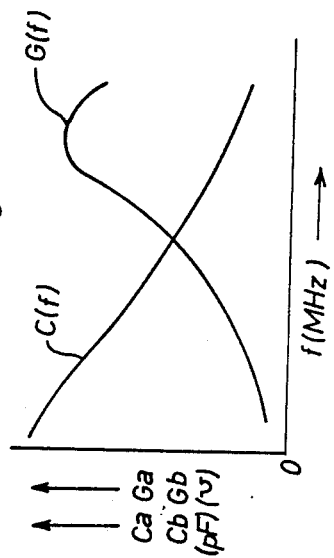
FIG. 26 is a graph illustrating the whole distributed conductance and capacitance of the equivalent circuit of FIG. 25 in relation to wireless frequency.
Figure 27:
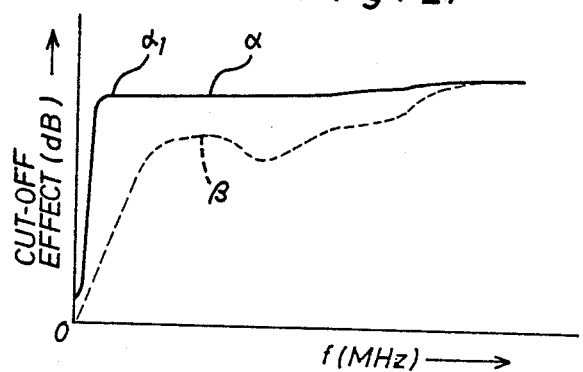
FIG. 27 is a graph illustrating the characteristic of the high frequency filter shown in FIG. 20.

In FIG. 24, the reference characters $L_1 \ldots L_n$ and $L_1' \ldots L_n'$ represent distributed inductances, the reference characters $G_1 \ldots G_n$ and $G_1' \ldots G_n'$ represent distributed conductances, the reference characters, $C_1 \ldots C_n$ and $C_1' \ldots C_n'$ represent distributed capacitances, and the reference characters $R_1 \ldots R_n$ represent distributed resistors. In the case that each of the distributed constant circuits $A_f$, B and $A_r$ is represented by the whole distributed inductances La, Lb, conductances Ga, Gb, capacitances Ca, Cb and/or resistors R, it becomes similar to a concentrated constant circuit $A_f'$, B' and $A_r'$ illustrated in FIG. 25. In this case, the whole distributed capacitances Ca, Cb and conductances Ga, Gb each are determined by the dielectric constant ε of insulation layer 72 and the parallel flat-plate construction formed between the resistance layers 173–177 and the electrode strips 73A–77A and 73B–77B. As is illustrated in FIG. 26, the whole distributed capacitances Ca, Cb and conductances Ga, Gb are respectively indicated by characteristic curves C(f) and G(f) in relation to the wireless frequency f(MHz). This means that as is illustrated by a character α in FIG. 27, the characteristic of high frequency filter 170 is effected substantially flat without causing any resonance phenomena in a high frequency region rather than in a low frequency region. In this high frequency filter 170, a thermal energy of the high frequency inductive current I is consumed by the resistance layers 173–177 such that the characteristic of filter 170 is much improved in the low region of the wireless frequency f when compared with the characteristic of the first embodiment, as shown by a dotted line β in FIG. 27.

Figure 28:
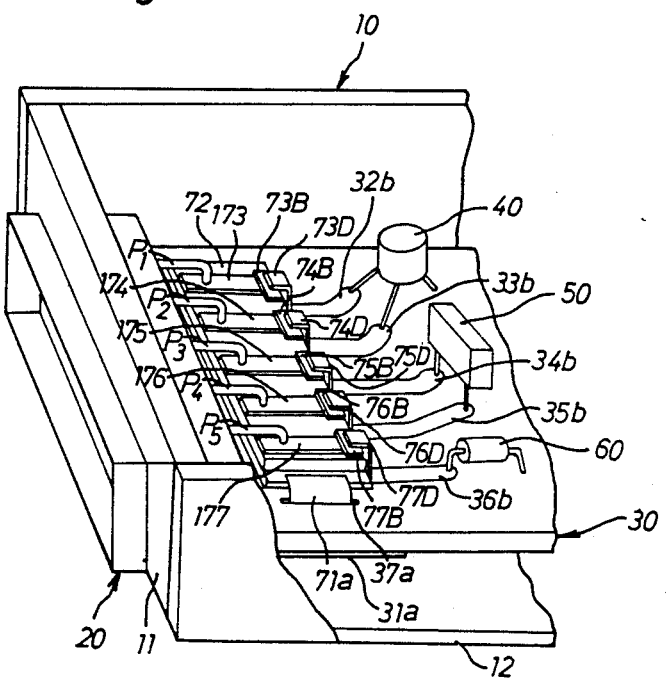
FIG. 28 illustrates a modification of the high frequency filter shown in FIG. 20.

Although the high frequency filter 170 has been arranged between the wiring layers 32a–36a and 32b–36b, the resistance layers 173–177 may be directly soldered at their front ends to the connecting pins $P_1$–$P_5$ of connector 20 as is illustrated in FIG. 28. In such a modification, the wiring layers 32a–36a, the electrode strips 73A–77A and their conductive legs 73C–77C can be removed to avoid high frequency noises directly applied thereto so as to enhance the characteristic of the high frequency filter 170.

Figure 29:
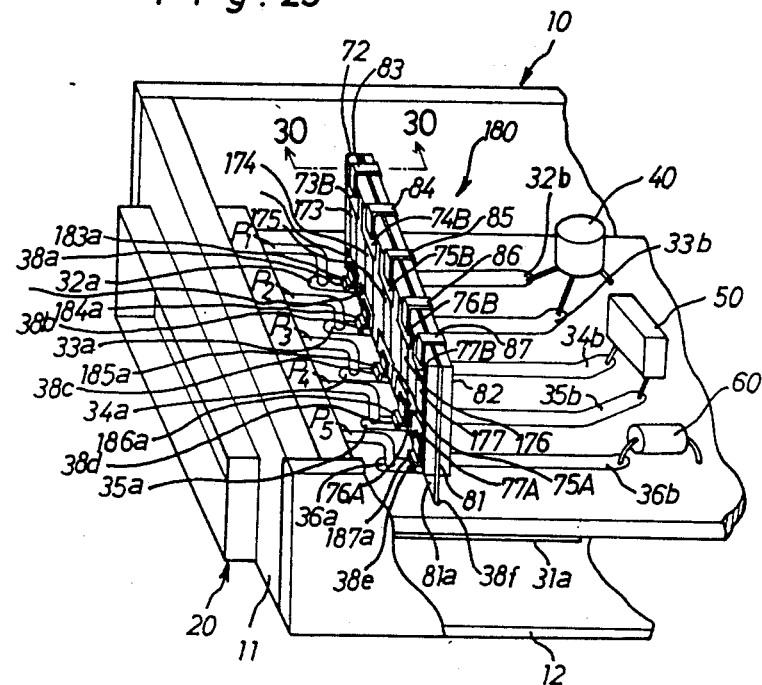
FIG. 29 illustrates a modification of the second embodiment shown in FIGS. 11 and 12.
Figure 30:
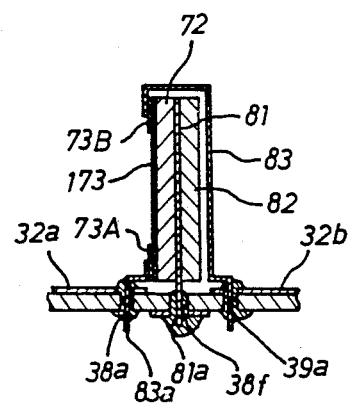
FIG. 30 is a cross-sectional view taken along line 30—30 in FIG. 29.

In FIGS. 29 and 30, there is illustrated a modification of the second embodiment shown in FIGS. 11 and 12, wherein the high frequency filter 80 is replaced with an upright high frequency filter 180. In the upright high frequency filter 180, the front arm portions 83a–87a of filter 80 are replaced with a plurality of parallel resistance layers 173–177 printed on the front surface of insulation layer 72. The resistance layers 173–177 each are made of a resistance material and are respectively formed at their opposite ends with a pair of electrode strips 73A, 73B; 74A, 74B; 75A, 75B; 76A, 76B; and 77A, 77B. The lower electrode strips 73A–77A each are integrally provided thereon with conductive legs 183a–187a which are inserted into the land holes 38a–38e and soldered to the wiring layers 32a–36a. The upper electrode strips 73B–77B each are soldered to the upper portions of electrode strips 83–87 of filter 80. The other construction of the upright high frequency filter 180 is substantially the same as that of the high frequency filter 80.

Figure 31:
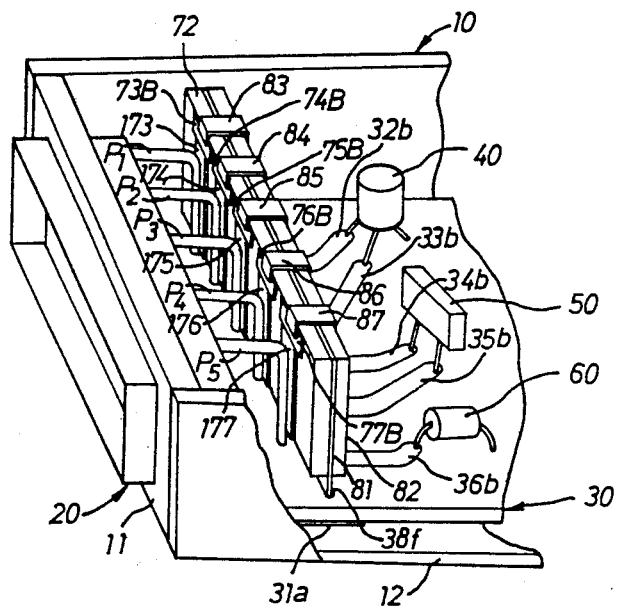
FIGS. 31, 32 and 33 illustrate modifications of the high frequency filter shown in FIG. 29.

Although in the above modification, the upright high frequency filter 180 has been mounted on the printed circuit board 30 between the wiring layers 32a–36a and the wiring layers 32b–36b, the resistance layers 173–177 may be directly soldered to the connecting pins $P_1$–$P_5$ of connector 20 as is illustrated in FIG. 31. In such an arrangement, the lower electrode strips 73A–77A and their conductive legs 183a–187a can be removed to avoid high frequency noises directly applied thereto so as to enhance the characteristic of the high frequency filter 180.

Figure 32:
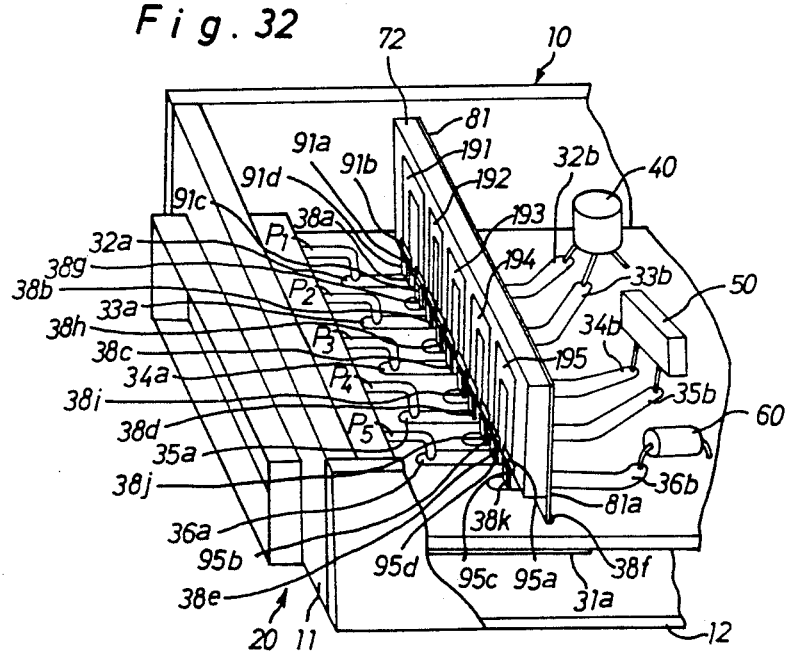
Figure 33:
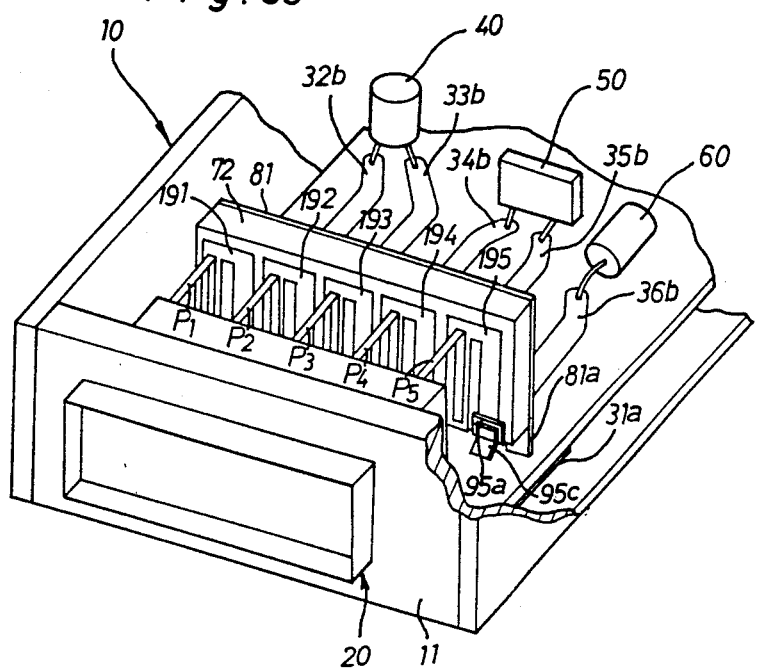

In FIG. 32, there is illustrated a modification of the high frequency filter 180, wherein the resistance layers 173–177 are replaced with U-letter shaped resistance layers 191–195 which are secured to the front surface of insulation layer 72. In this modification, the wiring layer 32b is extended between the wiring layers 32a and 33a, the wiring layer 33b is extended between the wiring layers 33a and 34a, the wiring layer 34b is extended between the wiring layers 34a and 35a, the wiring layer 35b is extended between the wiring layers 35a and 36a, and the wiring layer 36b is extended at the left side of wiring layer 36a. The resistance layers 191–195 are integrally provided at their left arm portions with conductive legs 91a–95a which are inserted into land holes 38g–38k and soldered to the wiring layers 32b–36b. The resistance layers 191–195 are integrally provided at their right arm portions with conductive legs 91b–95b which are inserted into land holes 38a–38e and soldered to the wiring layers 32a–36a. In FIG. 33, there is illustrated another modification of the high frequency filter 180, wherein the resistance layers 191–195 are directly soldered at their right arm portions to the connecting pins $P_1$–$P_5$ of connector 20.

Figure 25:
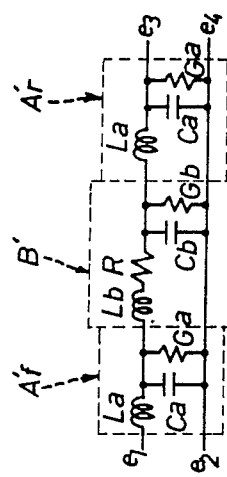
FIG. 25 illustrates an equivalent circuit of the disctributed constant circuit shown in FIG. 24.
Figure 34:
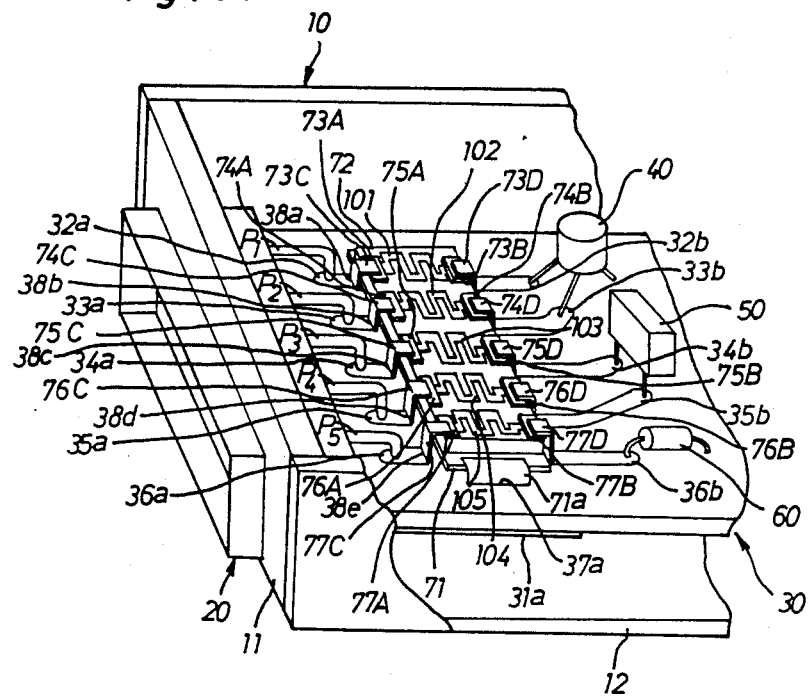
FIG. 34 illustrates another modification of the high frequency filter shown in FIGS. 20-22.

In FIG. 34, there is illustrated another modification of the high frequency filter 170 shown in FIGS. 20–22, wherein the resistance layers 173–177 are replaced with a plurality of electrode layers 101–105 which are formed by conductive paint for electrode printed in a zigzag configuration on the upper surface layer 72. The electrode layers 101–105 are connected at their opposite ends to each pair of electrode strips 73A, 73B; 74A, 74B; 75A, 75B; 76A, 76B; and 77A, 77B. In this modification, the whole distributed inductance Lb in FIG. 25 is increased by the zigzag configuration of the respective electrode layers 101-105. Alternatively, each of the electrode layers 101-105 may be modified as is illustrated in FIG. 35, wherein the electrode layer 101 is replaced with an electrode layer 101a which is formed by conductive paint printed in a spiral configuration on the upper surface of insulation layer 72. In this case, the spiral electrode 101a is connected at the outer end thereof with the electrode strip 73A and at the inner end thereof with the electrode strip 73B by means of a wire 101b. Furthermore, each of the electrode layers in FIGS. 34 or 35 may be made of resistance conductive material or replaced with a straight layer formed by compound of conductive paint and magnetic powder such as ferrite or Permalloy. FIG. 36 illustrates a further modification of the high frequency filter 170, wherein a layer 106 of magnetic material such as ferrite is formed on the electrode layers 101-105.

Figure 38:
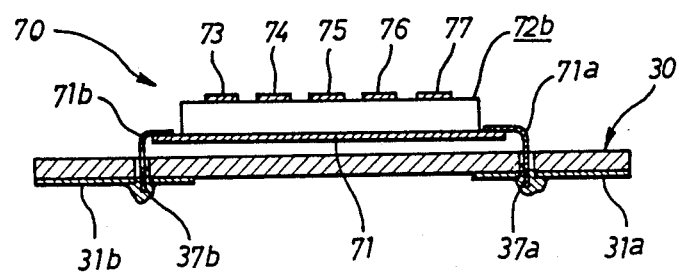
FIG. 38 is a cross-sectional view taken along line 38—38 in FIG. 37.
Figure 39:
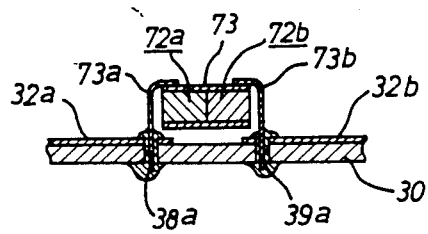
FIG. 39 is a cross-sectional view taken along line 39—39 in FIG. 27.
Figure 40:
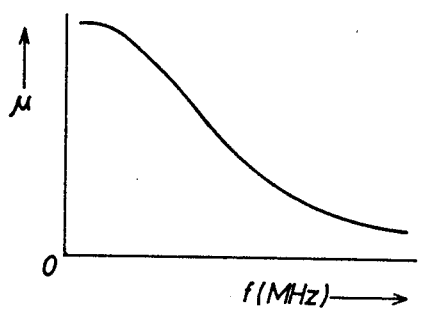
FIG. 40 is a graph illustrating a permeability of a magnetic substance layer in the high frequency filter of FIG. 37 in relation to wireless frequency.
Figure 41:
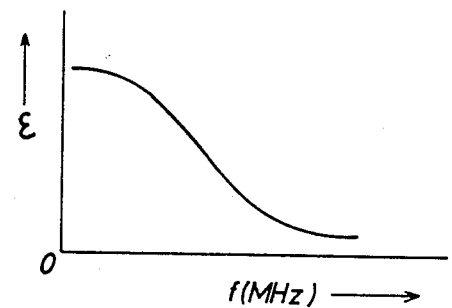
FIG. 41 is a graph illustrating a dielectric constant of a dielectric substance layer in the high frequency filter of FIG. 37 in relation to wireless frequency.

In FIGS. 37-39, there is illustrated a further modification of the high frequency filter 70 shown in FIGS. 2-4, wherein the insulation layer 72 is composed of a magnetic substance layer 72a and a dielectric substance layer 72b. The magnetic substance layer 72a is made of a magnetic material such as ferrite the permeability $\mu$ of which changes in relation to wireless frequency f as is illustrated in FIG. 40. The dielectric substance layer 72b is made of a dielectric material such as a compound of ferro-niobate and ferrotungsten the dielectric constant $\epsilon$ of which changes in relation to wireless frequency f as is illustrated in FIG. 41. In this case, the permeability $\mu$ of layer 72a and the dielectric constant $\epsilon$ of layer 72b are determined to be sufficiently higher than that of the air even when decreased in accordance with increase of the wireless frequency f(MHz). Furthermore, the thickness, lateral length and width of layer 72 are determined in 0.5 mm, 20 mm and 10 mm, respectively.

Figure 43:
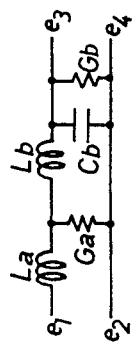
FIG. 43 illustrates an equivalent circuit of the distributed constant circuit shown in FIG. 42.
Figure 42:
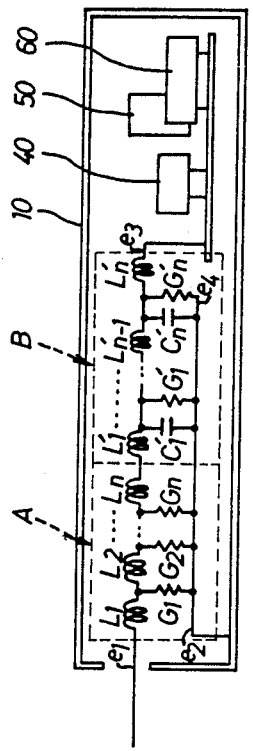
FIG. 42 illustrates a distributed constant circuit of the high frequency filter shown in FIG. 37.
Figure 44:
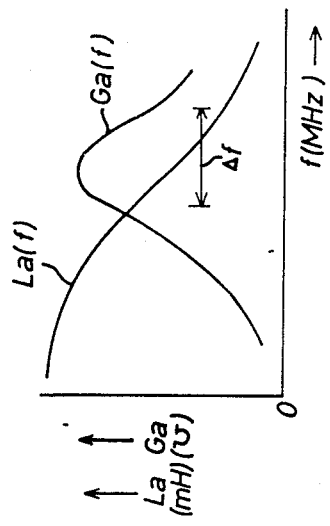
FIG. 44 is a graph illustrating the whole distributed inductance and conductance in the equivalent circuit of FIG. 43 in relation to wireless frequency.

In such a construction of the modified high frequency filter, each of the electrode strips 73-77 cooperates with the common electrode plate 71 through the magnetic substance layer 72a in a higher region of wireless frequency f to provide a plurality of distributed constant circuits A of the Lecher type which includes, as is illustrated in FIG. 42, a plurality of distributed inductances $L_1, L_2 \ldots L_n$, and a plurality of conductances $G_1, G_2 \ldots G_n$. In the case that the respective distributed constant circuits are represented by the whole distributed inductance La and the whole distributed conductance Ga, it becomes similar to a concentrated constant circuit illustrated in FIG. 43. The whole distributed inductance La is determined by the permeability $\mu$ of magnetic substance layer 72a and the parallel flat-plate construction formed between the electrode strips 7314 77 and the common electrode plate 71. In FIG. 44, the whole distributed inductance La in relation to wireless frequency f(MHz) is indicated by a characteristic curve La(f). The whole distributed conductance Ga is determined by the loss characteristic of the permeability of layer 72a and the parallel flat-plate construction between the electrode strips 73-77 and the common electrode plate 71. In FIG. 44, the whole distributed conductance Ga in relation to wireless frequency f(MHz) is indicated by a characteristic curve Ga(f).

Figure 45:
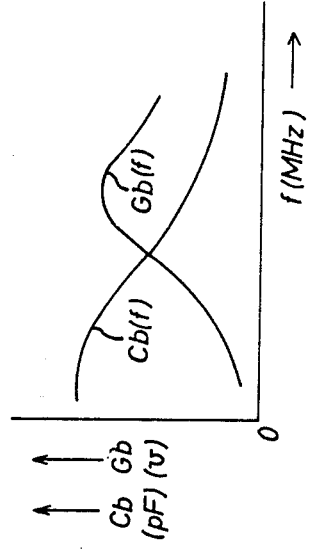
FIG. 45 is a graph illustrating the whole distributed capacitance and conductance in the equivalent circuit of FIG. 43 in relation to wireless frequency.
Figure 46:
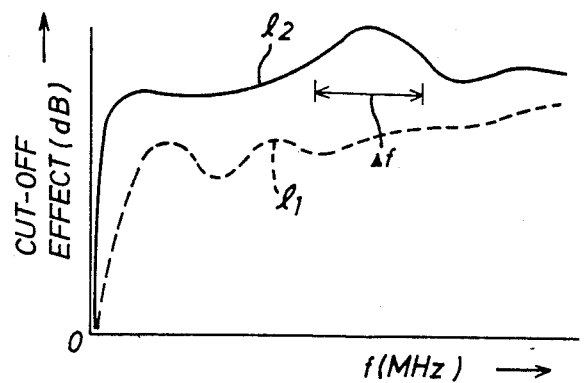
FIG. 46 is a graph illustrating the characteristic of the high frequency filter shown in FIG. 37.

In a lower region of the wireless frequency f, each of the electrode strips 73-77 cooperates with the common electrode plate 71 through the dielectric substance layer 72b to provide a plurality of parallel-plate condensers which act as a filter. In a higher region of the wireless frequency f, each of the electrode strips 73-77 cooperates with the common electrode plate 71 through the dielectric substance layer 72b to provide a plurality of distributed constant circuits of the Lecher type B which includes, as is illustrated in FIG. 42, a plurality of distributed inductances $L_1', L_2' \ldots L_n'$, a plurality of distributed capacitances $C_1', C_2' \ldots C_n'$, and a plurality of distributed conductances $G_1', G_2' \ldots G_n'$. In the case that each of the distributed constant circuits B is represented by the whole distributed inductance Lb, capacitance Cb and conductance Gb, it becomes similar to a concentrated constant circuit illustrated in FIG. 43. The whole distributed capacitance Cb and conductance Gb are determined by the dielectric constant $\epsilon$ of layer 72b and the parallel flat-plate construction between the electrode stips 73-77 and the common electrode plate 71. In FIG. 45, the whole distributed capacitance Cb and conductance Gb are respectively indicated by characteristic curves Cb(f) and Gb(f) in relation to the wireless frequency f(MHz). This means that as is illustrated by a dotted line $l_1$ in FIG. 46, the modified high frequency filter acts as a low-pass filter the characteristic of which is effected substantially flat without causing any resonance phenomena in a high frequency region rather than in a low frequency region.

From the above description, the mutual function of magnetic substance layer 72a and dielectric substance layer 72b will be understood as follows. As shown by the characteristic curve La(f) in FIG. 44, the whole distributed inductance La decreases in accordance with increase of the wireless frequency f. It is, therefore, noted that in a relatively lower region of the wireless frequency, the whole distributed inductance La acts as a high input impedance in relation to the dielectric substance layer 72b to enhance the characteristic of the modified high frequency filter. As shown by the characteristic curve Ga(f) in FIG. 44, the whole distributed conductance Ga reaches a maximum value in a relatively higher region $\Delta f$ of the wireless frequency f. It is, therefore, noted that in the higher region of wireless frequency f, the whole distributed conductance Ga acts as a short-circuit impedance in relation to the dielectric substance layer 72b to enhance the characteristic of the modified high frequency filter. As a result, the whole characteristic of the modified high frequency filter is effected as shown by a solid curve $l_2$ in FIG. 46.

Figure 47:
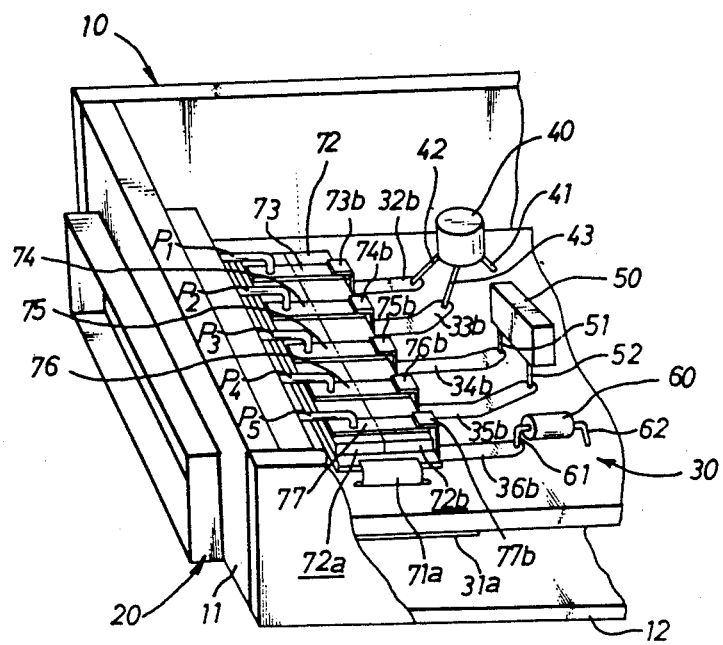
FIG. 47 illustrates a modification of the high frequency filter shown in FIG. 37.

In use of the modified high frequency filter, various electromagnetic waves will give rise to a high frequency inductive current I flowing to the high frequency filter through the leading wires $W_1-W_5$ and the connectors 20a, 20. In this instance, the dielectric substance layer 72b acts to reflect a relatively low level portion of the inductive current I and causes it to flow toward the bottom wall 12 of casing 10, and the magnetic substance layer 72a cooperates with the dielectric substance layer 72b to absorb a relatively high level portion of the inductive current I and causes it to flow toward the bottom wall 12 of casing 10. In the actual practice of the modified high frequency filter, the electrode strips 73 -77 may be directly soldered to the connecting pins $P_1-P_5$ of connector 20, as is illustrated in FIG. 47.

Figure 48:
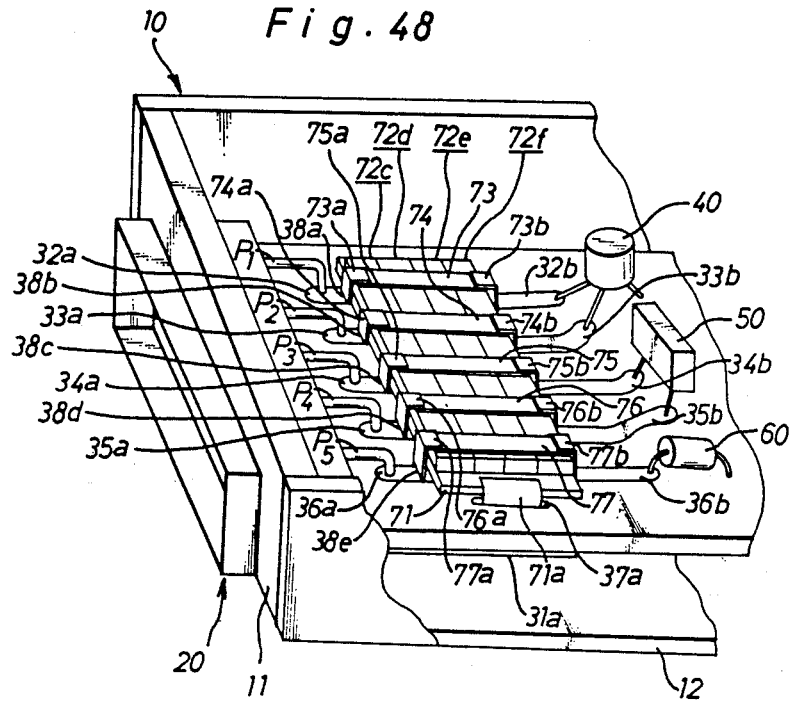
FIG. 48 illustrates another modification of the high frequency filter shown in FIGS. 2-4.

In FIG. 48, there is illustrated another modification of the high frequency filter 70, wherein the insulation layer 72 is composed of a first magnetic substance layer 72c, a first dielectric substance layer 72d, a second magnetic substance layer 72e and a second dielectric substance layer 72f. In this modification, the first magnetic substance layer 72c is made of the same material as that of the magnetic substance layer 72a of FIG. 37, and the first dielectric substance layer 72d is made of the same material as that of the dielectric substance layer 72b of FIG. 37. The second magnetic substance layer 72e is made of magentic material such as ferrite the permeability of which decreases in accordance with increase of wireless frequency f at a different tendency from the permeability of layer 72c. The second dielectric substance layer 72f is made of dielectric material including barium titanate as a main component the dielectric constant of which decreases in accordance with increase of the wireless frequency f at a different tendency from the dielectric constant of layer 72b.

Figure 49:
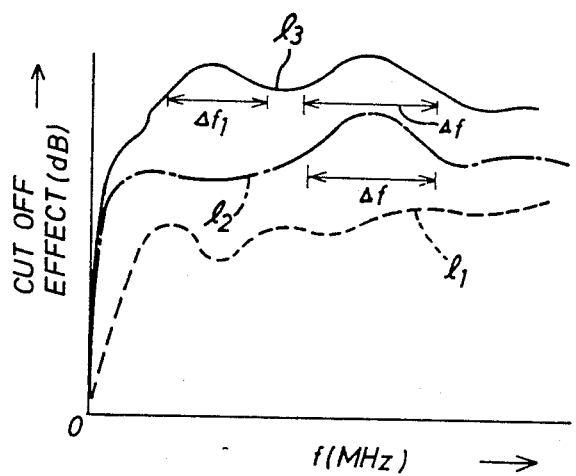
FIG. 49 is a graph illustrating the characteristic of the high frequency filter shown in FIG. 48.

In such a construction of the high frequency filter, the first magnetic and dielectric substance layers 72c, 72d and the second magnetic and dielectric substance layers 72e, 72f are arranged to provide a pair of Lecher type distributed constant circuits A, B and A, B in cascade connection which corresponds with the Lecher type distributed constant circuits A and B in cascade connection shown in FIG. 42. Assuming that as is illustrated in FIG. 49, the whole distributed conductance Ga of the first magnetic substance layer 72c reaches a maximum value in a higher region $\Delta f$ of wireless frequency f and that the whole distributed conductance Ga of the second magnetic substance layer 72e reaches a maximum value in a lower region $\Delta f_1$ of wireless frequency f, the whole characteristic of the high frequency filter will be effected as shown by a characteristic curve $l_3$ in FIG. 49. From the above fact, it will be understood that the specific arrangement of the first magnetic and dielectric substance layers 72c, 72d and the second magnetic and dielectric substance layers 72e, 72f is effective to enhance the characteristic of the high frequency filter uniformly in a wider region of wireless frequency.

Figure 50:
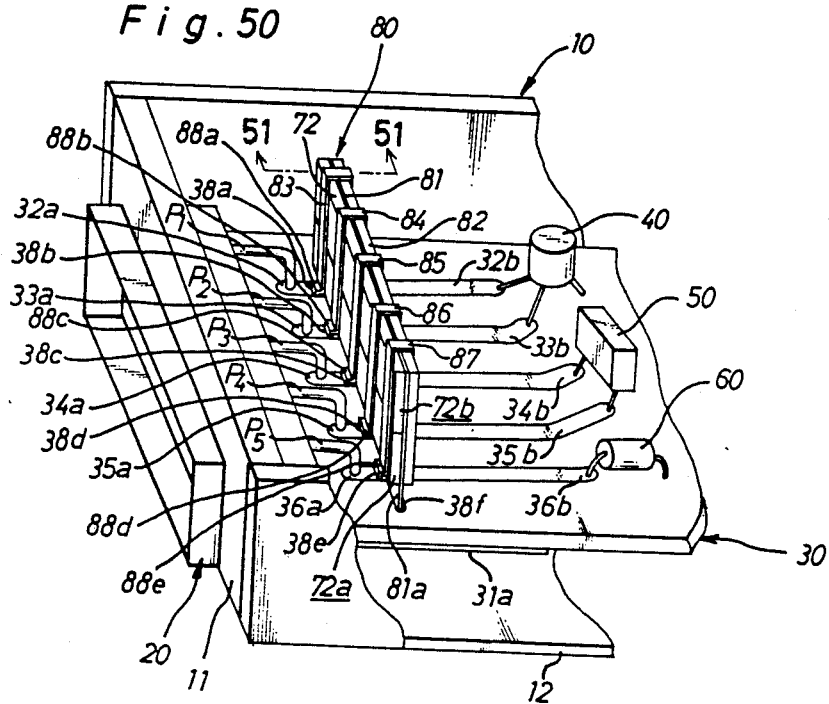
FIG. 50 illustrates a modification of the high frequency filter shown in FIGS. 11 and 12.
Figure 51:
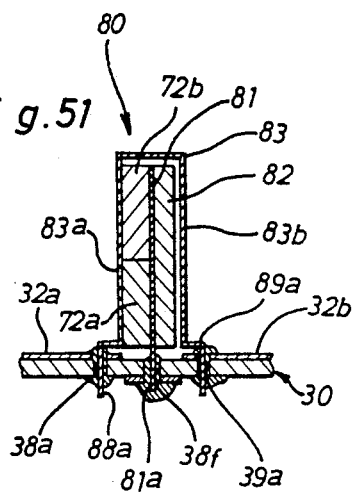
FIG. 51 is a cross-sectional view taken along line 51—51 in FIG. 50.
Figure 52:
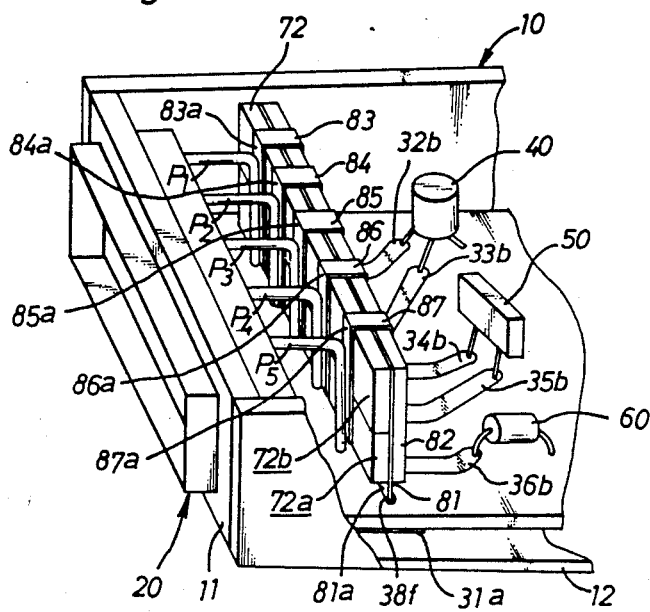
FIG. 52 illustrates a modification of the high frequency filter shown in FIGS. 50 and 51.
Figure 53:
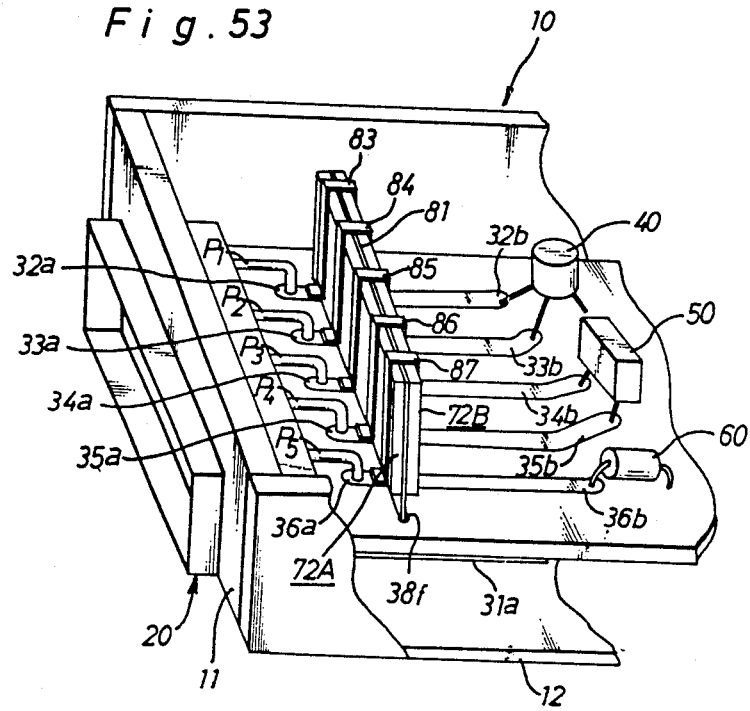
FIG. 53 illustrates a modification of the high frequency filter shown in FIGS. 11 and 12.

In FIGS. 50 and 51, there is illustrated a modification of the high frequency filter 80 shown in FIGS. 11 and 12, wherein the insulation layer 72 is composed of a magnetic substance layer 72a secured to the lower portion of common electrode plate 81, and a dielectric substance layer 72b secured to the upper portion of common electrode plate 81. In this modification, the electrode strips 83-87 may be directly soldered at their front arm portions 83a-87a to the connecting pins $P_1$-$P_5$, as is illustrated in FIG. 52. In FIG. 53, there is illustrated another modification of the high frequency filter 80, wherein the insulation layer 72 is replaced with a magnetic substance layer 72A secured to the front surface of common electrode plate 81, and the aluminous base plate 82 is replaced with a dielectric substance layer 72B secured to the rear surface of common electrode plate 81.

Figure 54:
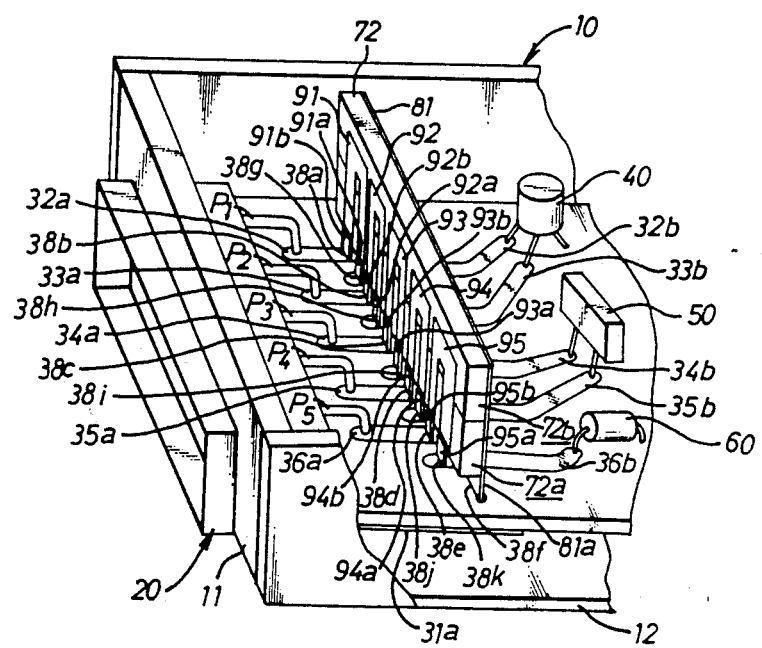
FIG. 54 illustrates a modification of the high frequency filter shown in FIG. 14.
Figure 55:
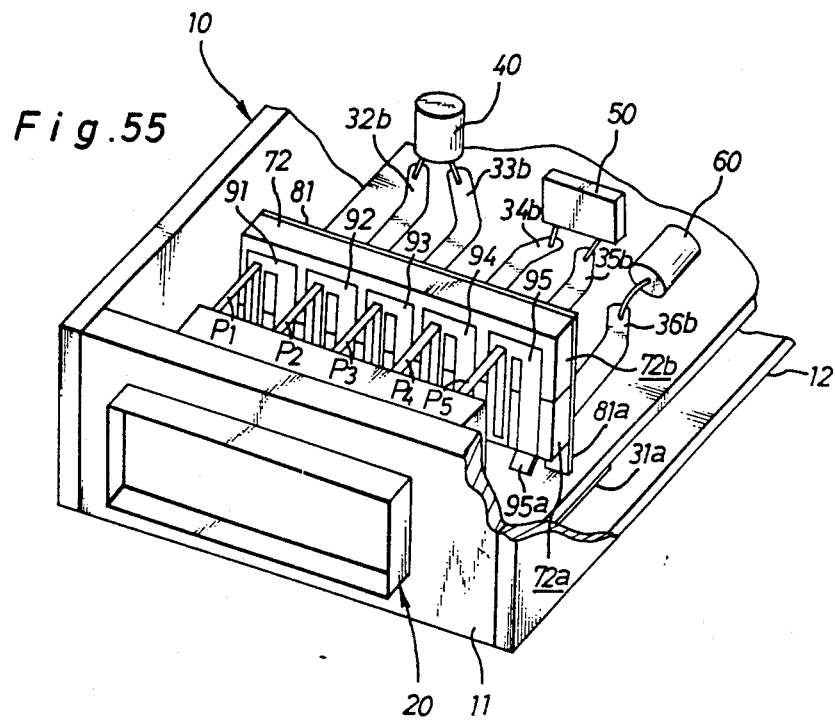
FIG. 55 illustrates a modification of the high frequency filter shown in FIG. 54.
Figure 56:
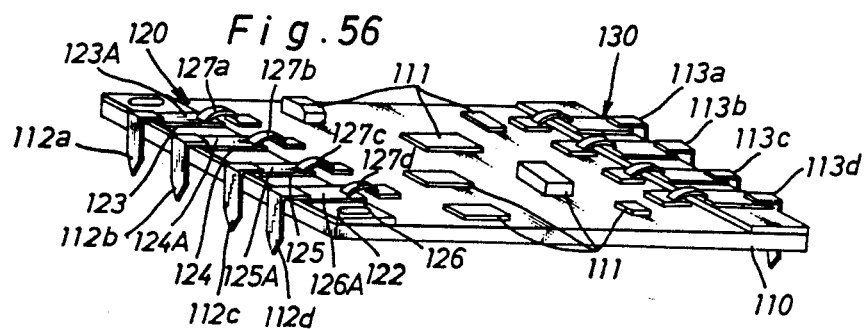
FIGS. 56 and 57 illustrate a modification of the high frequency filter shown in FIGS. 18 and 19.
Figure 57:
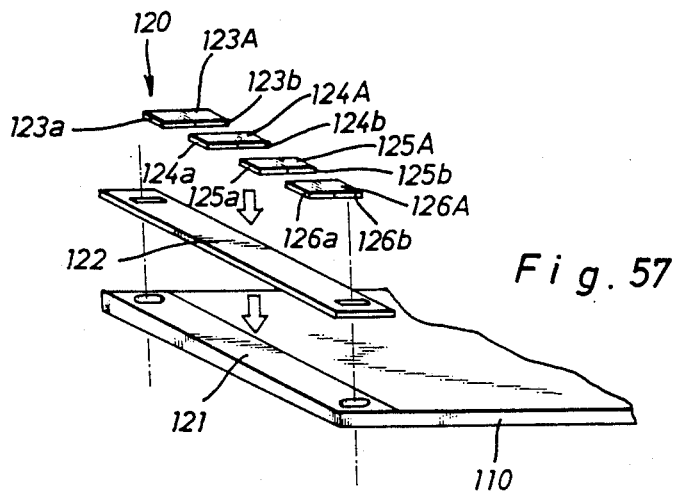

In FIG. 54, there is illustrated a modification of the high frequency filter shown in FIG. 14, wherein the insulation layer 72 is composed of a magnetic substance layer 72a secured to the lower portion of common electrode plate 81, and a dielectric substance layer 72b secured to the upper portion of common electrode plate 81. In the modification of FIG. 54, the electrode strips 91-95 may be directly soldered at their right arm portions to the connecting pins $P_1$-$P_5$ of connector 20, as is illustrated in FIG. 55. In FIGS. 56 and 57, there is a modification of the high frequency filters 120 shown in FIGS. 18 and 19, wherein the insulation layers 123a-126a are replaced with magnetic substance layers 123a-126a and dielectric substance layers 123b-126b, and the wiring layers 126b-126b are replaced with electrode strips 123A-126A secured to each pair of magnetic and dielectric substance layers 123a, 123b; 124a, 124b; 125a, 125b; and 126a, 126b.

From the various modifications described above, it will be understood that the insulation layer 72 of the high frequency filter 70 may be formed by a combination of a plurality of magnetic substance layers and/or dielectric substance layers. Alternatively, the arrangement of the magnetic substance layer and the dielectric substance layer may be changed in an appropriate order.

In the actual practices of the present invention, it is preferable that each of the insulation substance layers described in the above embodiments or modifications is made of ferroelectric substance having dielectric constant-radio frequency property in which a dielectric constant at a radio frequency 1 MHz is larger than or equal to 8000 and in which a relaxation frequency is larger than or equal to 100 MHz. In this case, the relaxation frequency is given by an arithmetic mean value between dielectric constants respectively at frequencies of 1 MHz and 1000 MHz.

The above property of the ferroelectric substance has been experimentally recognized by the inventors as follows.

Figure 61:
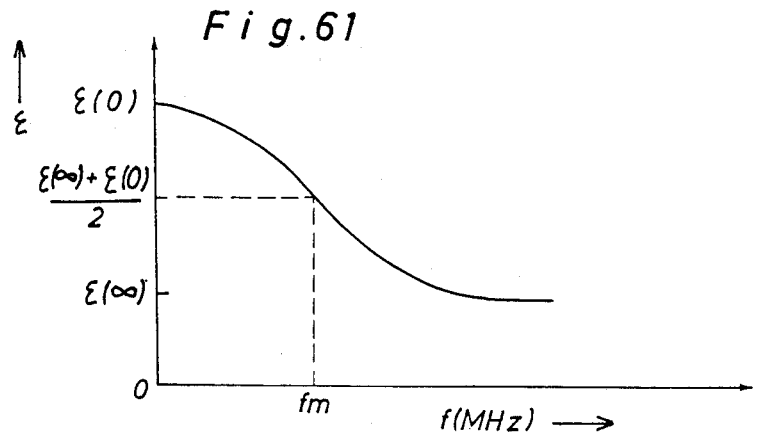

Dielectric constant-radio frequency property of dielectric substance is represented by the following Debye's dispersion equation.

$$\dot{\epsilon} = \epsilon(\infty) + [\epsilon(0) - \epsilon(\infty)]/[1 + (f/f_m)^2] - \qquad (1)$$
$$j(f/f_m)/[1 + (f/f_m)^2 \times (\epsilon(0) - \epsilon(\infty))]$$

wherein $\epsilon$ is a complex dielectric constant, wherein $\epsilon(\infty)$ is a dielectric constant at a sufficient high frequency, wherein $\epsilon(0)$ is a dielectric constant in electrostatic field, and wherein $f_m$ is a relaxation frequency. The equation (1) is represented by a graph shown in FIG. 61. From the graph, it will be understood that the dielectric constant-radio frequency property is determined by $\epsilon(o)$ and $f_m$. In addition, $$\epsilon(fm) = \{\epsilon(0) + \epsilon(\infty)\}/2.$$

Figure 62:
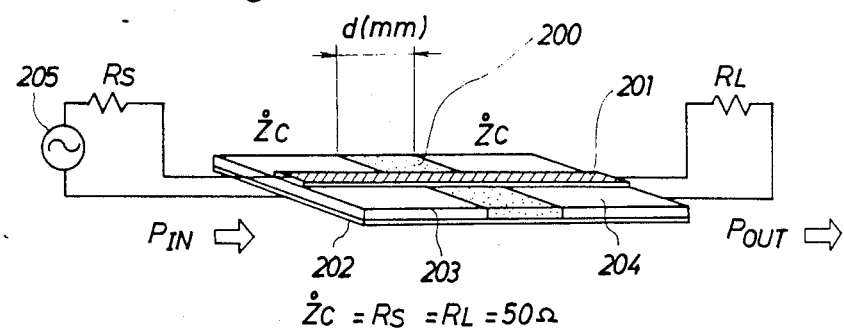
FIG. 62 illustrates an electric circuit for experimentation.

FIG. 62 illustrates an electric circuit for experimentally measuring a cut-off property of a filter including a ferroelectric substance layer 200 having the above dielectric constant-radio frequency property. The substance layer 200 is sandwiched between a signal electrode 201 and a ground electrode 202 together with a pair of dielectric substances 203, 204 respectively forming an impedance of 50 ohms. For measurement of the quantity $T_p$ of electric power transmission, a high frequency oscillator 205 is connected between both one ends of the electrodes 201, 202 through a resister Rs, and a load resister RL is connected between the other ends of electrodes 201, 202. In this case, the quantity $T_p$ is represented by the following equation.

$$T_p = 20 \log \sqrt{P\,\text{out}/P\,\text{in}} = -20 \log \qquad (2)$$
$$[\tfrac{1}{4} \times \{(4 + \dot{\epsilon}) + (4 - \dot{\epsilon})\cos 2\beta d\}]^{\tfrac{1}{2}}$$

wherein Pin is an input power, wherein Pout is an output power and wherein $$\beta d = \pi \sqrt{\dot{\epsilon}} f \times d/150000.$$

Figure 63:
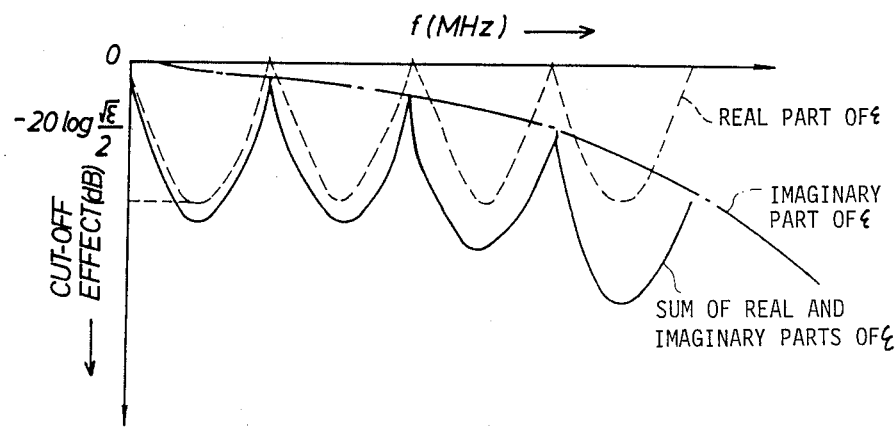
FIG. 63 depicts graphs indicative of cut-off effect-radio frequency in relation to dielectric constant.

When $\dot{\epsilon}$ of the equation (1) is substituted into the equation (2), the equation (2) is represented by a graph shown in FIG. 63.

Figure 64:
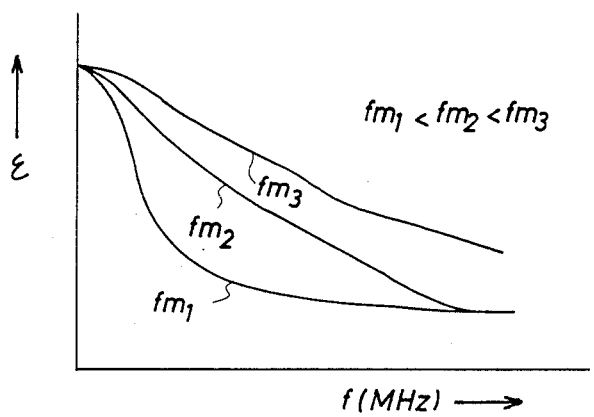
FIGS. 64 and 65 depict graphs indicative of dielectric constant-radio frequency respectively.

As is understood from the graph of FIG. 63, $T_p$ is a function of real and imaginary parts of $\dot{\epsilon}$, sum of which defines dielectric constant-radio frequency property of dielectric substance. The quantity of attenuation of $T_p$ is substantially determined by $\dot{\epsilon}$ at a predetermined frequency. This means that the quantity of attenuation of $T_p$ is larger when $\dot{\epsilon}$ is larger. In other words, it is requested that to obtain high cut-off effect in wider frequency range, $\dot{\epsilon}$ is larger and the rate in decrease of $\dot{\epsilon}$ related to increase of the frequency is smaller. In addition, the cut-off effect property of a high frequency filter may be determined by frequency property of $\dot{\epsilon}$. As shown in FIG. 64, it is preferable that $f_m$ takes a larger value to a certain extent to make $\dot{\epsilon}$ larger in a cut-off range.

For measurement of dielectric constant-radio frequency property of ferroelectric substance and cut-off effect against electromagnetic waves, a sample in the form of a circular plate of 4 mm×5 mm has been prepared in the former measurement, and another sample in the form of a rectangular plate of 10×10×0.5 mm has been prepared in the latter measurement. In this case, silver paste has been printed on both surfaces of the circular plate and also printed on a surface of the rectangular plate in strip configurations.

Figure 65:
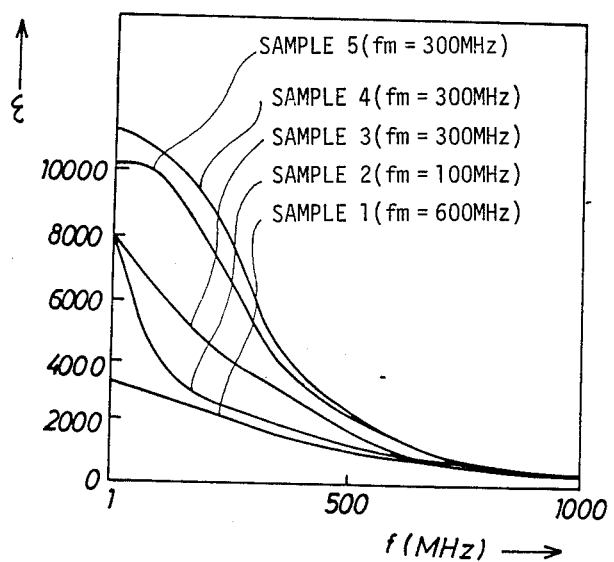

FIG. 65 illustrates a frequency property of $\epsilon$. In the figure, a sample 1 is a material mainly including $BaTiO_3$, and a sample 2 is ceramic which is formed with compound of $Pb(Mg_{\frac{1}{3}}Nb_{\frac{2}{3}})O_3$ of 90 mol % and $PbTiO_3$ of 10 mol %. A sample 3 is a single material of $Pb(Mg_{\frac{1}{3}}Nb_{\frac{2}{3}})O_3$, a sample 4 is ceramic formed with compound of $Pb(Fe_{\frac{1}{2}}Mb_{\frac{1}{2}})O_3$ of 75 mol % and $Pb(Fe_{\frac{2}{3}}W_{\frac{1}{3}})O_3$ of 25 mol %, and a sample 5 is ceramics formed with compound of the sample 4 and ZnO of 0.2 Wt %. Additionally, $f_m$ is given in a frequency range of 1 MHz to 1000 MHz by $\epsilon(fm) = \{\epsilon(1\ MHz) + \epsilon(1000\ MHz)\}/2$.

Figure 60:
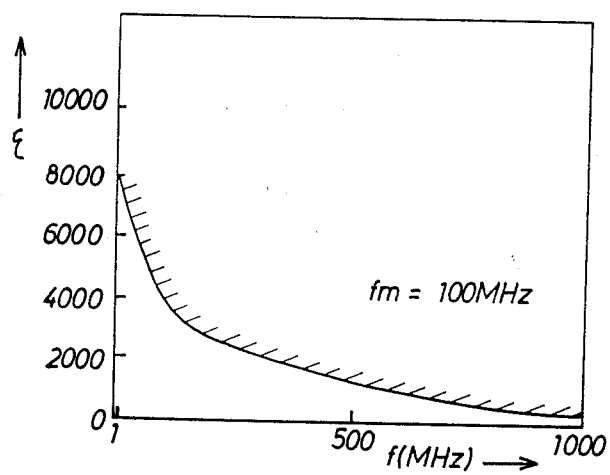
FIGS. 60 and 61 depict graphs indicative of dielectric constant-radio frequency properties respectively.
Figure 66:
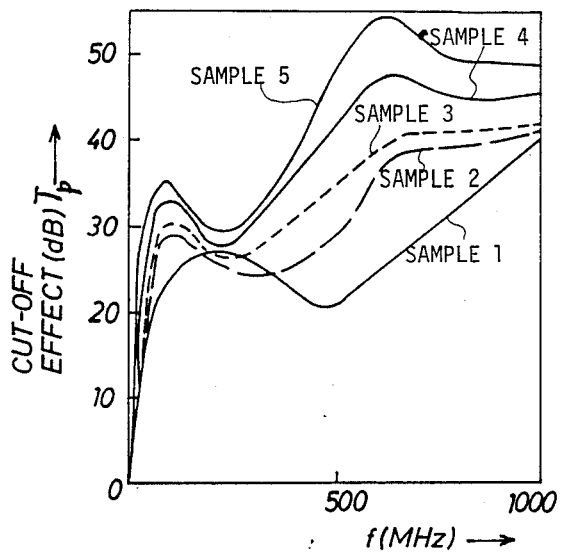
FIG. 66 depicts graphs indicative of cut-off effect-radio frequency.

FIG. 66 illustrates the cut-off property against electromagnetic waves which has a high cut-off effect in relation to a larger value of each of $\epsilon$, fm. From this result, it is preferable that to obtain a high cut-off effect, $\epsilon(1\ MHz) \geq 8000$ and $fm = 100$ MHz. This means that a frequency property of $\epsilon$ is required to be maintained in a predetermined range shown in FIG. 60.

Figure 58:
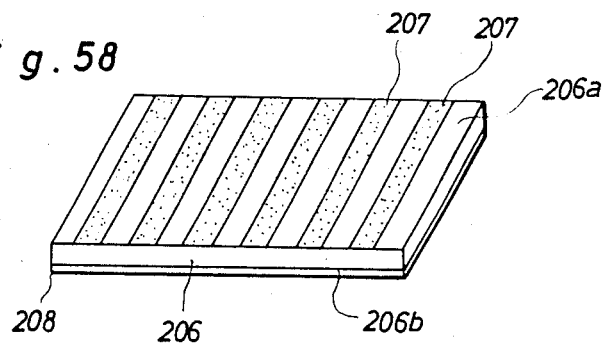
FIGS. 58 and 59 illustrate respective modifications of the high frequency filter shown in FIG. 11.
Figure 59:
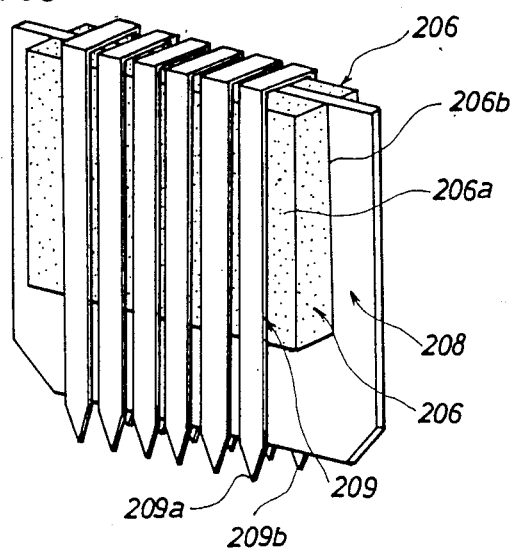

FIG. 58 illustrates a filter element in the form of a parallel plate condenser which comprises a ferroelectric substance layer 206 having the above-mentioned dielectric constant-radio frequency property. On the upper surface 206a of the substance layer 206, a plurality of strip electrodes 207 are formed, while a ground electrode 208 is formed on the lower surface 206b of substance layer 206. Furthermore, FIG. 59 illustrates another filter element which comprises a pair of substance layers 206, 206 superposed through the ground electrode 208, and a plurality of U-letter shaped connecting pins 209 assembled on the layers 206, 206. In this case, the substance layer 206 is formed with $Pb(Fe_{\frac{1}{2}}Nb_{\frac{1}{2}})X$-$(Fe_{\frac{2}{3}}W_{\frac{1}{3}})_{1-x}O_3$, wherein x=0.75.

Figure 67:
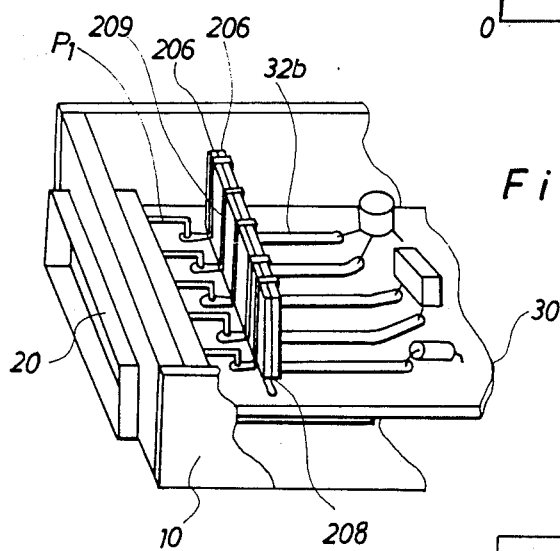
FIG. 67 illustrates assemble condition of the filter element shown in FIG. 59.

In FIG. 67, there is illustrated a high frequency filter in which the filter element shown in FIG. 59 is assembled on the printed board 30 in replacement of the filter 80 shown in FIG. 11. In this case, the high frequency filter has cut-off property defined by sample 4 of FIG. 66. Additionally, FIG. 66 depicts respective cut-off properties of remaining samples 1 to 3 and 5 which are formed with ferroelectric substance having the above dielectric constant-radio frequency property. As is understood from FIG. 66, it is required that $\epsilon \geq 8000$ at 1(MHz) and that fm=100(MHz) in a range of radio frequency 1 to 1000 (MHz).

Figure 68:
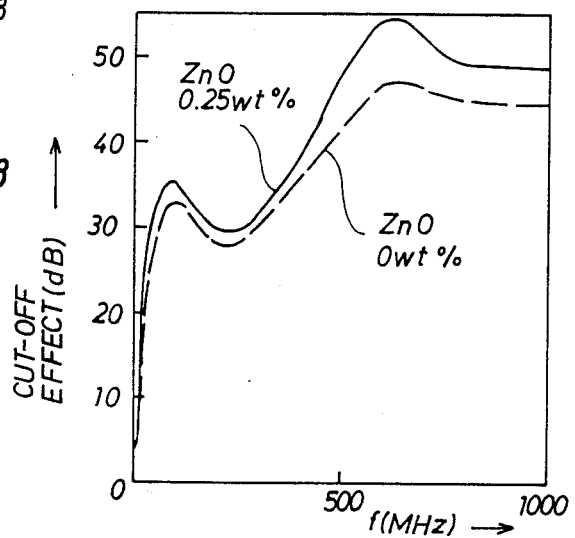
FIG. 68 depicts a graph indicative of cut-off effect-radio frequency.

Finally, FIG. 68 illustrates cut-off property which is given by compound mainly including $Pb(Fe_{\frac{1}{2}}Nb_{\frac{1}{2}})O_3$ and $Pb(Fe_{\frac{2}{3}}W_{\frac{1}{3}})O_3$ with ZnO of 0.25 Wt % and another cut-off property which is given by the compound without ZnO. This means that tan $\delta$ is increased owing to addition of, for instance, ZnO to enhance the cut-off effect.

Having now fully set forth both structure and operation of preferred embodiments of the concept underlying the present invention various other embodiments as well as certain variations and modifications of the embodiments herein shown and described will obviously occur to those skilled in the art upon becoming familiar with said underlying concept. It is to be understood, therefore, that within the scope of the appended claims, the invention may be practiced otherwise than as specifically set forth herein.

What is claimed is:

1. A high frequency filter for an electric instrument including a casing of metallic conductive material, an internal electric circuit element arranged within said casing, and a connector mounted on a peripheral wall of said casing for connecting said internal electric circuit element to an external electric circuit, the high frequency filter comprising:

an insulation substance layer arranged between said connector and a connection terminal of said circuit element, said insulation substance layer including a first section made of a dielectric material whose dielectric constant decreases or increases in accordance with an increase of a decrease of wireless frequency applied thereto and further including a second section made of a magnetic material whose permeability decreases or increases in accordance with an increase or decrease of wireless frequency applied thereto; and a pair of conductive layers formed on opposite surfaces of the first and second sections of said insulation substance layer, one of said conductive layers eing connected at one end thereof to said connector and at the other end thereof to the connection terminal of said circuit element, end the other conductive layer being connected to a portion of said casing.

2. A high frequency filter as claimed in claim 1, wherein said insulation substance layer includes at least first and second sections respectively made of a dielectric material whose dielectric constant decreases or increases in accordance with an increase or a decrease of wireless frequency applied thereto.

3. A high frequency filter as claimed in claim 1, wherein said insulation substance layer includes at least first and second sections respectively made of a magnetic material whose permeability decreases or increases in accordance with an increase or a decrease of wireless frequency applied thereto.

4. A high frequency filter as claimed in claim 1, wherein said insulation substance layer includes at least first and second sections respectively made of different kinds of dielectric material or magnetic material.

5. A high frequency filter for an electric instrument including a casing of metallic conductive material, a circuit board of insulation material arranged in place within said casing, an internal electric circuit mounted on said circuit board, a connector mounted on a peripheral wall of said casing for connecting a plurality of terminals of said internal electric circuit to a plurality of leading wires extending from an external electric circuit, the high frequency filter comprising:
- a common electrode plate arranged in parallel with said circuit board at a space between said connector and the terminals of said internal electric circuit and being connected to a portion of said casing;
- a single insulation substance layer formed on said common electrode plate, said insulation substance layer being made of a ferroelectric substance in the form ofa lead composition or compound with a perovskite structure whose dielectric constant decreases or increases in accordance with an increase or a decrease of wireless frequency applied thereto; and
- a plurality of parallel electrode strips mounted on said insulation substance layer and being connected at their one ends to said connector and at their other ends to the terminals of said internal electric circuit;
- said electrode strips each being opposed to said common electrode plate through said insulation substance layer to provide a plurality of parallel-plate condensers effective in a lower region of the wireless frequency and to provide a plurality of distributed constant circuits effective in a higher region of the wireless frequency.

6. A high frequency filter for an electric instrument including a casing of metallic conductive material, a circuit board of insulation material arranged in place within said casing, an internal electric circuit mounted on said circuit board, a connector mounted on a peripheral wall of said casing for connecting a plurality of terminals of said internal electric circuit to a plurality of leading wires extending from an external electric circuit, the high frequency filter comprising:
- a common electrode plate arranged perpendicularly to said circuit board at a space between said connector and the terminals of said internal electric circuit and being connected at one end thereof to a portion of said casing;
- a single insulation substance layer formed on one face of said common electrode plate, said insulation substance layer being made of a ferroelectric substance in the form of a lead composition or compound with a perovskite structure whose dielectric constant decreases or increases in accordance with an increase or a decrease of wireless frequency applied thereto; and
- a plurality of U-shaped electrode strips each having a first arm portion secured to one face of said insulation substance layer for connection to said connector and a second arm portion spaced from the other face of said common electrode plate for connection to one of the terminals of said internal electric circuit,
- wherein said electrode strips each are opposed at the first arm portion thereof to said common electrode plate through said insulation substance layer to provide a plurality of parallel-plate condensers effective in a lower region of the wireless frequency and to provide a plurality of distributed constant circuits effective in a higher region of the wireless frequency.

7. A high frequency filter for an electric instrument including a casing of metallic conductive material, a circuit board of insulation material arranged in place within said casing, an internal electric circuit mounted on said circuit board, a connector mounted on a peripheral wall of said casing for connecting a plurality of terminals of said internal electric circuit to a plurality of leading wires extending from an external electric circuit, the high frequency filter comprising:
- a common electrode plate arranged perpendicularly to said circuit board at a space between said connector and the terminals of said internal electric circuit and being connected at one end thereof to a portion of said casing;
- a single insulation substance layer formed on one face of said common electrode plate, said insulation substance layer being made of a ferroelectric substance in the form of a lead composition or compound with a perovskite structure whose dielectric constant decreases or increases in accordance with an increase or a decrease of wireless frequency applied thereto; and
- a plurality of U-shaped electrode strips formed on one face of said insulation substance layer and each having one end for connection to said connector and another end for connection to one of the terminals of said internal electric circuit,
- wherein said electrode strips each are opposed to said common electrode plate through said insulation substance layer to provide a plurality of parallel-plate condensers effective in a lower region of the wireless frequency and to provide a plurality of distributed constant circuits effective in a higher region in the wireless frequency.

8. A high frequency filter for an electric instrumentt including a casing of metallic conductive material, an internal electric circuit element arranged within said casing, and a connector mounted on a peripheral wall of said casing for connecting said internal electric circuit element to an external electric circuit, the high frequency filter comprising:
- an insulation substance layer arranged between said connector and a connection terminal of said circuit element, said insulation substance layer being mede of a dielectric material those dielectric constant decreases or increases in accordance with an increase or a decrease of wireless frequency applied thereto; and
- a pair of conductive layers formed on opposite surfaces of said insulation substance layer, one of said conductive layers being connected at one end thereof to the connection terminal of said circuit element, and the other conductive layer being connected to a portion of said casing;
- wherein said insulation substance layer is made of a ferroelectric substance which is a lead composition or compound with a perovskite structure.

9. A high frequency filter as claimed in claim 8, wherein said ferroelectric substance is ceramic of Pb(Mg$_{\frac{1}{3}}$Nb$_{\frac{2}{3}}$)O$_3$ system.

10. A high frequency filter as claimed in claim 8, wherein said ferroelectric substance is ceramic of Pb(Fe$_{\frac{1}{2}}$Nb$_{\frac{1}{2}}$)O$_3$ system.

11. A high frequency filter as claimed in claim 8, wherein said ferroelectric substance is ceramics mainly including Pb(Fe$_{\frac{1}{2}}$Nb$_{\frac{1}{2}}$)$_x$ (Fe$_{\frac{2}{3}}$W$_{\frac{1}{3}}$)$_{1-x}$O$_3$ type (0.5≦x≦0.8).

12. A high frequency filter as claimed in claim 8, wherein said ferroelectric substance includes mainly Pb(Fe$_{\frac{1}{2}}$Nb$_{\frac{1}{2}}$)$_x$(Fe$_{\frac{2}{3}}$W$_{\frac{1}{3}}$)$_{1-x}$O$_3$ type (0.5≦x≦0.8) and subsidiarily at least one of transition element oxide, zinc oxide and tin oxide in 0.1 wt % to 1.0 wt %.

13. A high frequency filter for an electric instrument including a casing of metallic conductive material, a circuit board of insulation material arranged in place within said casing, an internal electric circuit mounted on said circuit board, a connector mounted on a peripheral wall of said casing for connecting a plurality of terminals of said internal electric circuit to a plurality of leading wires extending from an external electric circuit, the high frequency filter comprising:

a common electrode plate arranged in parallel with said circuit board at a space between said connector and the terminals of said internal electric circuit and being connected to a portion of said casing;

a single insulation substance layer formed on said common electrode plate, said insulation substance layer being made of a ferroelectric substance in the form of a lead composition or compound with a perovskite structure whose dielectric constant decreases or increases in accordance with an increase or a decrease of wireless frequency applied thereto; and a plurality of parallel electrode strips mounted on said insulation substance layer and being connected at their one ends to said connector and at their other ends to the terminals of said internal electric circuit;

said electrode strips each being opposed to said common electrode plate through said insulation substance layer to provide a plurality of parallel-plate condensers effective in a lower region of the wireless frequency and to provide a plurality of distributed constant circuits effective in a higher region of the wireless frequency;

Wherein said insulation substance layer includes a first section made of a dielectric material whose dielectric constant decreases or increases in accordance with an increase or a decrease of wireless frequency applied thereto and further includes a second section made of e magnetic material whose permeability decreases or increases in accordance with an increase or a decrease of wireless frequency applied thereto.

14. A high frequency filter for an electric instrument including a casing of metallic conductive material, a circuit board of insulation material arranged in place within said casing, an internal electric circuit mounted on said circuit board, a connector mounted on a peripheral wall of said casing for connecting a plurality of terminals of said internal electric circuit to a plurality of leading wires extending from an external electric circuit, the high frequency filter comprising:

a common electrode plate arranged perpendicularly to said circuit board at a space between said connector and the terminals of said internal electric circuit end being connected at one end thereof to a portion of said casing;

a single insulation substance layer formed on one face of said common electrode plate, said insulation substance layer being made of a ferroelectric substance in the form of a lead composition or compound with a perovskite structure whose dielectric constant decreases or increases in accordance with an increase or a decrease of wireless frequency applied thereto; and a plurality of U-shaped electrode strips each having a first arm portion secured to one face of said insulation substance layer for connection to said connector and a second arm portion spaced from the other face of said common electrode plate for connection to one of the terminals of said internal electric circuit;

said electrode strips each being opposed at the first arm portion thereof to said common electrode plate through said insulation substance layer to provided a plurality of parallel-plate condensers effective in a lower region of the wireless frequency and to provide a plurality of distributed constant circuits effective in a higher region of the wireless frequency;

wherein said insulation substance layer includes a first section made of a dielectric material whose dielectric constant decreases or increases in accordance with an increase or a decrease of wireless frequency applied thereto and further includes a second section made of a magnetic material whose permeability decreases or increases in accordance with an increase or a decrease of wireless frequency applied thereto.

15. A high frequency filter for an electric instrument including a casing of metallic conductive material, a circuit board of insulation material arranged in place within said casing, an internal electric circuit mounted on said circuit board, a connector mounted on a peripheral wall of said casing for connecting a plurality of terminals of said internal electric circuit to a plurality of leading wires extending from an external electric circuit, the high frequency filter comprising:

a common electrode plate arranged perpendicularly to said circuit board at a space between said connector and the terminals of said internal electric circuit and being connected at one end thereof to a portion of said casing;

a single insulation substance layer formed on one face of said common electrode plate, said insulation substance layer being made of a ferroelectric substance in the form of a lead composition or compound with a perovskite structure whose dielectric constant decreases or increases in accordance with an increase or a decrease of wireless frequency applied thereto; and a plurality of U-shaped electrode strips formed on one face of said insulation substance layer and each having one end for connection to said connector and another end for connection to one of the terminals of said internal electric circuit.

said electrode strips each being opposed to said common electrode plate through said insulation substance layer to provide a plurality of parallel-plate condensers effective in a lower region of the wireless frequency and to provide a plurality of distributed constant circuits effective in a higher region in the wireless frequency;

wherein said insulation substance layer includes a first section made of a dielectric material whose dielectric constant decreases or increases in accordance with an increase or a decrease of wireless frequency applied thereto and further includes a second section made of a magnetic material whose permeability decreases or increases in accordance with an increase or a decrease of wireless frequency applied thereto.

16. A high frequency filter for an electric instrument including a casing of metallic conductive material, a circuit board of insulation material arranged in place within said casing, an internal electric circuit mounted on said circuit board, a connector mounted on a peripheral wall of said casing for connecting a plurality of terminals of said internal electric circuit to a plurality of leading wires extending from an external electric circuit, the high frequency filter comprising:
- a common electrode arranged perpendicularly to said circuit board at a space between said connector and the terminals of said internal electric circuit and being connected at one end thereof to a portion of said casing;
- a first insulation substance layer secured to one face of said common electrode plate, said first insulation substance layer being made of a magnetic material whose permeabllilty decreases or increases in accordance with an increase or a decrease of wireless frequency applied thereto;
- a second insulation substance layer secured to the other face of said common electrode plate, said second insulation substance layer being made of a dielectric material whose dielectric constant decreases or increases in accordance with an increase of a decrease of wireless frequency applied thereto;
- a plurality of U-shaped electrode strips each having a first arm portion secured to said first insulation substance layer for connection to said connector and a second arm portion secured to said second insulation substance layer for connection to one of the terminals of said internal electric circuit;
- wherein said electrode strips each are opposed at the first arm portion thereof to sail common electrode plate through said first insulation substance layer and opposed at the second arm portion thereof to said common electrode plate through said second insulation substance layer to provide a plurality of parallel-plate condensers effective in a lower region of the wireless frequency and to provide a plurality of distributed constant circuits effective in a higher region of the wireless 17. A high frequency filter for an electric instrument including a casing of metallic conductive material, a circuit board of insulation material arranged in place within said casing, an internal electric mounted on said circuit board, a connector mounted on a peripheral wall of said casing for connecting a plurality of terminals of said internal electric circuit to a plurality of leading wires extending from an external electric circuit, the high frequency filter comprising:
- a common electrode plate arranged perpendicularly to said circuit board at a space between said connector and the terminals of said internal electric circuit and being connected at one end thereof to a portion of said casing;
- a pair of insulation substance layers secured to opposite surfaces of said common electrode plate, said insulation substance layers each being made of a dielectric material whose dielectric constant decreases or increases in accordance with an increase or a decrease of wireless frequency applied thereto;
- a plurality of U-shaped connecting pins each having a first arm portion secured to one of said insulation substance layers for connection to said connector and a second arm portion secured to the other insulation substance layer for connection to one of the terminals of said internal electric circuit;
- wherein said electrode connecting pins each are opposed at the first arm portion thereof to said common electrode plate through the one of said insulation substance layers and opposed at the second arm portion thereof to said common electrode plate through the other insulation substance layer to provide a plurality of parallel-plate condensers effective in a lower region of the wireless frequency and to provide a plurality of distributed constant circuits effective in a higher region of the wireless frequency.

* * * * *